United States Patent
Blauvelt et al.

(10) Patent No.: US 7,148,465 B2
(45) Date of Patent: *Dec. 12, 2006

(54) SEMICONDUCTOR PHOTODETECTOR WITH INTERNAL REFLECTOR

(75) Inventors: Henry A. Blauvelt, San Marino, CA (US); David W. Vernooy, Sierra Madre, CA (US); Hao Lee, Arcadia, CA (US)

(73) Assignee: Xponent Photonics Inc, Monrovia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/345,055

(22) Filed: Jan. 31, 2006

(65) Prior Publication Data

US 2006/0131482 A1 Jun. 22, 2006

Related U.S. Application Data

(63) Continuation of application No. 10/661,709, filed on Sep. 12, 2003, now Pat. No. 6,992,276.

(60) Provisional application No. 60/417,805, filed on Oct. 10, 2002.

(51) Int. Cl.
    *H01L 31/00* (2006.01)

(52) U.S. Cl. .................... 250/214.1; 257/432

(58) Field of Classification Search ............ 250/214.1, 250/216; 257/432, 436, 437; 385/14, 48, 385/49, 51, 88, 89, 92, 94, 129–131
See application file for complete search history.

(56) References Cited

U.S. PATENT DOCUMENTS

| | | |
|---|---|---|
| 5,218,223 A | 6/1993 | Spaeth et al. |
| 5,344,746 A | 9/1994 | Vettiger et al. |
| 5,793,062 A | 8/1998 | Kish et al. |
| 5,932,114 A | 8/1999 | Makiuchi |
| 5,999,670 A | 12/1999 | Yoshimura et al. |
| 6,108,472 A | 8/2000 | Rickman et al. |
| 6,229,160 B1 | 5/2001 | Krames et al. |
| 6,246,097 B1 | 6/2001 | Kato et al. |
| 6,323,063 B1 | 11/2001 | Krames et al. |
| 6,339,607 B1 | 1/2002 | Jiang et al. |

(Continued)

FOREIGN PATENT DOCUMENTS

EP 0807981 A2 11/1997

(Continued)

OTHER PUBLICATIONS

Bazylenko et al, Fabrication of Light-Turning Mirrors in Buried-Channel silica Waveguides for Monolithic and Hybrid Integration, Journal of Lightwave Technology, Jan. 1997, pp. 148-153, vol. 15, No. 1.

(Continued)

*Primary Examiner*—Stephone B. Allen
*Assistant Examiner*—Suezu Ellis
(74) *Attorney, Agent, or Firm*—David S. Alavi; Christie Parker & Hale LLP

(57) ABSTRACT

A photodetector comprises a semiconductor substrate with entrance and reflecting faces formed at the substrate upper surface. The reflecting face forms an acute angle with the substrate surface and is positioned so that an optical beam transmitted through the entrance face into the substrate is internally reflected from the reflecting face toward the substrate upper surface. A photodetector active region is formed on the substrate upper surface and is positioned so that the reflected optical beam impinges on the active region. The photodetector may be mounted on a second substrate for receiving an optical beam from a planar waveguide formed on the second substrate or an optical fiber mounted in a groove on the second substrate.

35 Claims, 12 Drawing Sheets

U.S. PATENT DOCUMENTS

| | | |
|---|---|---|
| 6,353,250 B1 | 3/2002 | Fukano |
| 6,570,190 B1 | 5/2003 | Krames et al. |
| 6,617,568 B1 | 9/2003 | Matsuda |
| 6,753,587 B1 | 6/2004 | Furuya et al. |
| 6,768,136 B1 | 7/2004 | Eisert et al. |
| 6,885,795 B1 | 4/2005 | Hsu et al. |
| 6,921,956 B1 | 7/2005 | Yang et al. |
| 6,992,276 B1 * | 1/2006 | Blauvelt et al. ......... 250/214.1 |
| 2002/0122615 A1 | 9/2002 | Painter et al. |
| 2002/0172459 A1 | 11/2002 | Baily et al. |

FOREIGN PATENT DOCUMENTS

| | | |
|---|---|---|
| JP | 06029566 | 2/1994 |

OTHER PUBLICATIONS

Bouadma et al, 1.3-um GaInAsP/InP Buried-Ridge-Structure Laser and its Monolithic Integration with Photodetector Using RI Beam Etching, Journal of Lightwave Technology, May 1994, pp. 742-748, vol. 12, No. 5.

Chao et al, Fresnel Analysis of Effective Mirror Reflectivity in Folded-Cavity In-Plane Surface-Emitting Lasers, IEEE Photonics Technology Letters, Apr. 1993, pp. 390-392, vol. 4, No. 4.

Fukano et al, A Low-Cost Edge-Illuminated Refracting-Facet Photodiode Module with Large Bandwidth and High Responsivity, Journal of Lightwave Technology, Jan. 2000, pp. 79-83, vol. 18, No. 1.

Fukano et al, High-Responsivity and Low-Operation-Voltage Edge-Illuminated Refracting-Facet Photodiodes with Large Alignment Tolerance, Journal of Lightwave Technology, May 1997, pp. 894-899, vol. 15, No. 5.

Fukano et al, Edge-illuminated refracting-facet photodiode with high responsivity and low-operation voltage, Electronics Letters, Dec. 5, 1996, pp. 2346-2348, vol. 32, No. 25.

Gfeller et al, 50 mW CW-Operated Single-Mode Surface-Emitting AlGaAs Lasers with 45 deg Total Reflection Mirrors, IEEE Photonics Technology Letters, Jul. 1992, pp. 698-700, vol. 4, No. 7.

Hilleringmann et al, Optoelectronic System Integration on Silicon:Waveguides, Photodetectors, and VLSI CMOS Circuits on One Chip, IEEE Transactions on Electron Devices, May 1995, pp. 841-846, vol. 42, No. 5.

Jones et al, Hybrid integration onto silicon motherboards with planar silica waveguides, IEE Proc. Optoelectron., Oct. 1996, pp. 316-321, vol. 143, No. 5.

Kato et al, Large Coupling Tolerance Side-Illuminated Mirror Photodiode for Low-Cost Surface Hybrid Integration, IEEE Photonics Technology Letters, Jun. 1999, pp. 709-711, vol. 11, No. 6.

Strandman et al, Fabrication of 45 deg Mirrors Together with Well-Defined V-Grooved Using Wet Anisotropic Etching of Silicon, Journal of Microelectromechanical Systems, Dec. 1995, pp. 213-219, vol. 4, No. 4.

Terui et al, Novel Micromirror for Vertical Optical Path Conversion Formed in Silica-Based PLC Using Wettability Control of Resin, Journal of Lightwave Technology, Sep. 1998, pp. 1631-1639, vol. 16, No. 9.

Zurhelle et al, Highly Efficient Waveguide-Detector Coupling Structures for Integrated Opto-Electronical Circuits on Silicon, Journal of Lightwave Technology, Mar. 1996, pp. 410-416, vol. 14, No. 3.

European Search Report dated Apr. 5, 2006 for Application No. EP 03 75 2217 (2 pages).

* cited by examiner

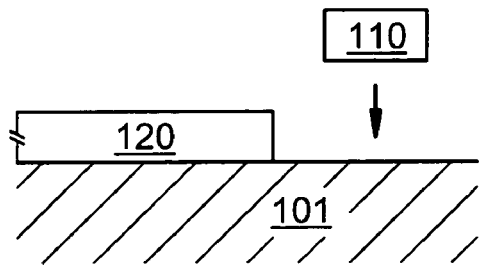
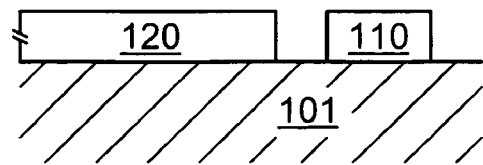
FIG. 1A      FIG. 1B
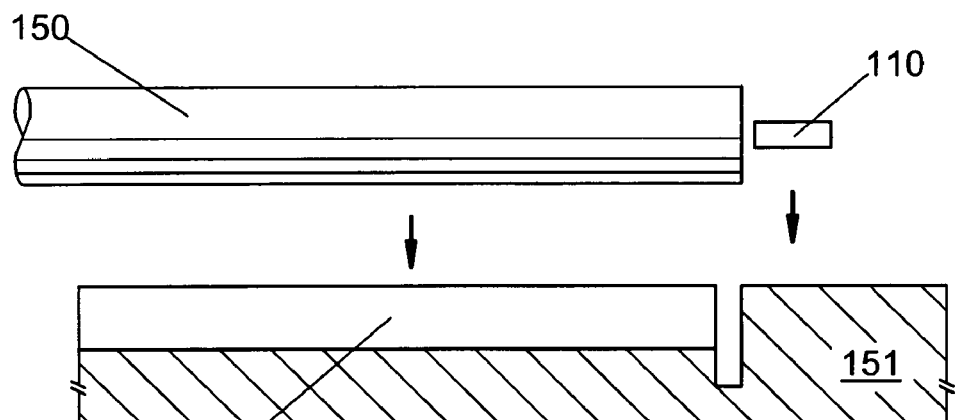
FIG. 1C
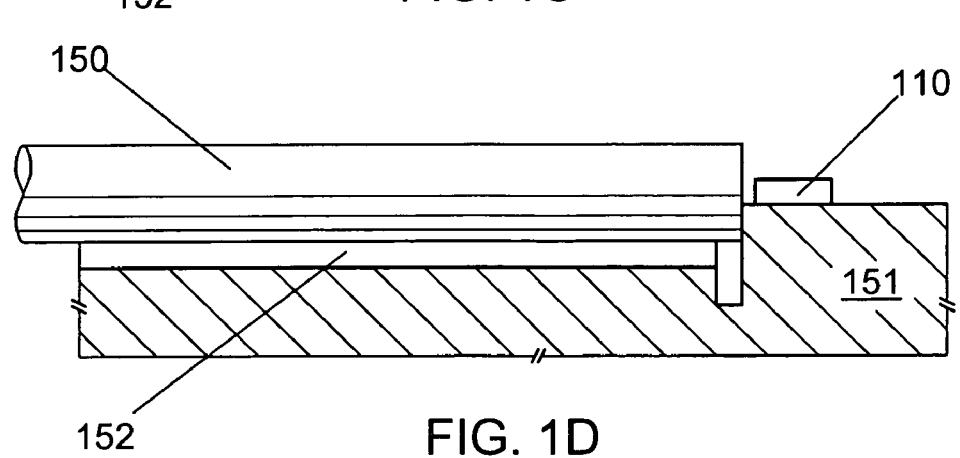
FIG. 1D

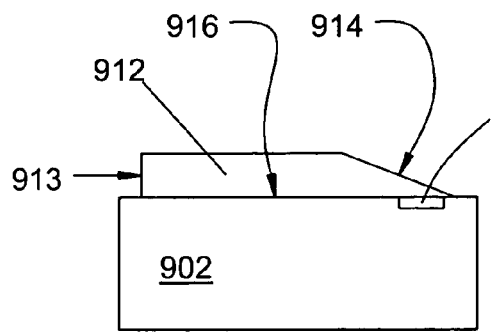
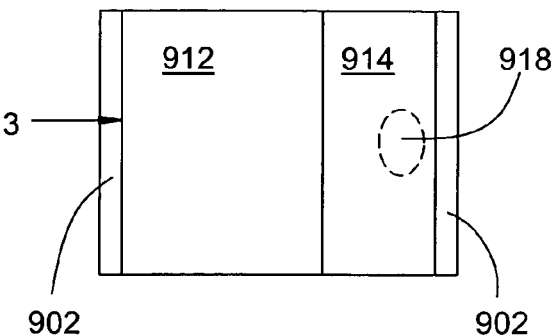
FIG. 9A    FIG. 9B
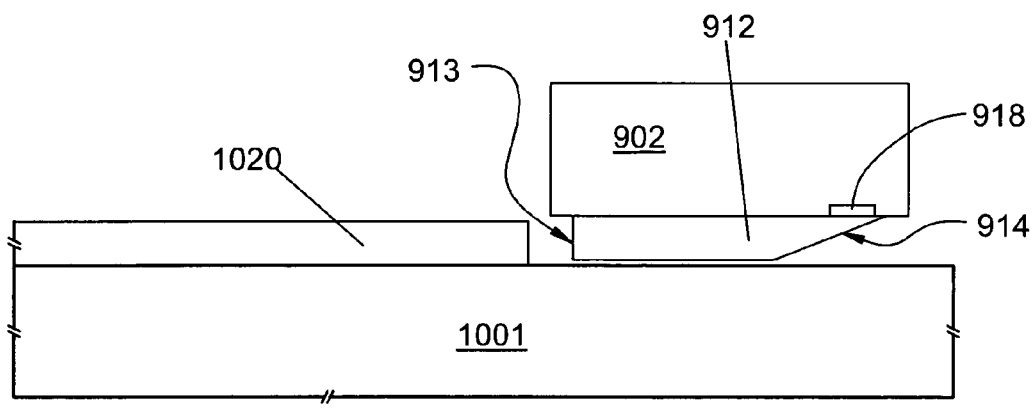
FIG. 10
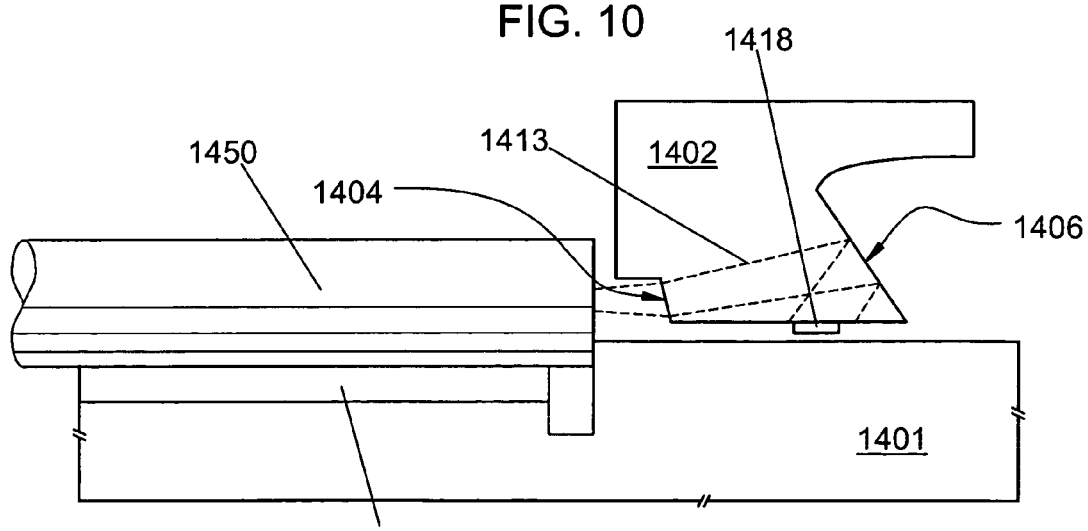
FIG. 14

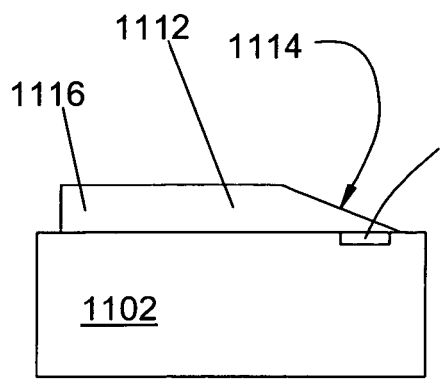
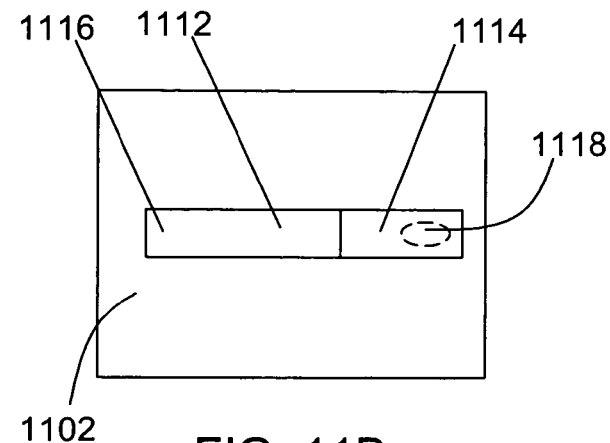
FIG. 11A  FIG. 11B
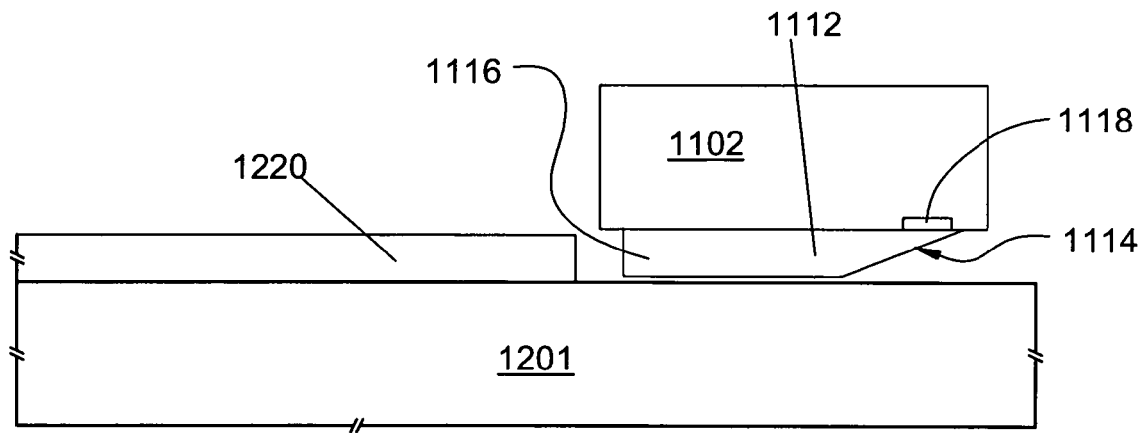
FIG. 12
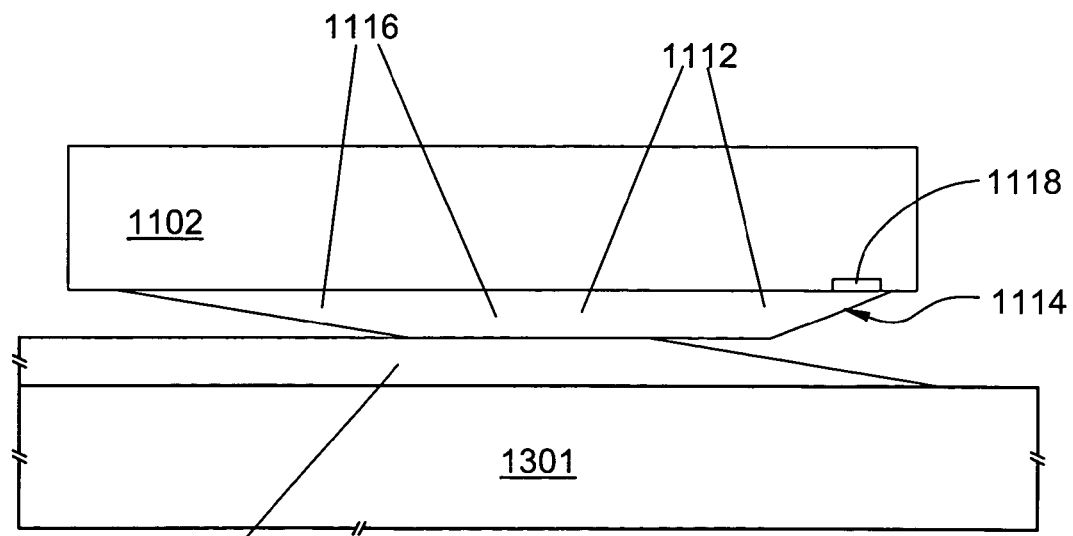
FIG. 13

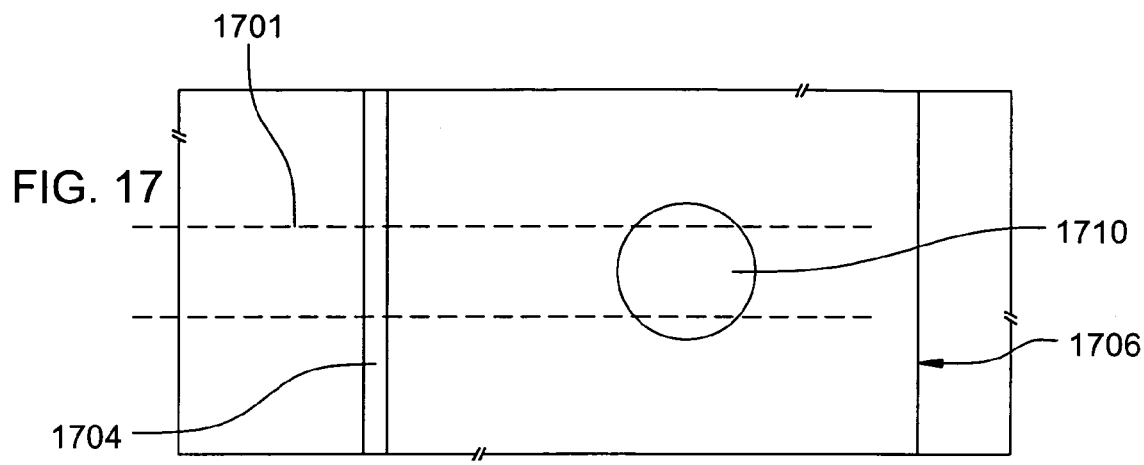
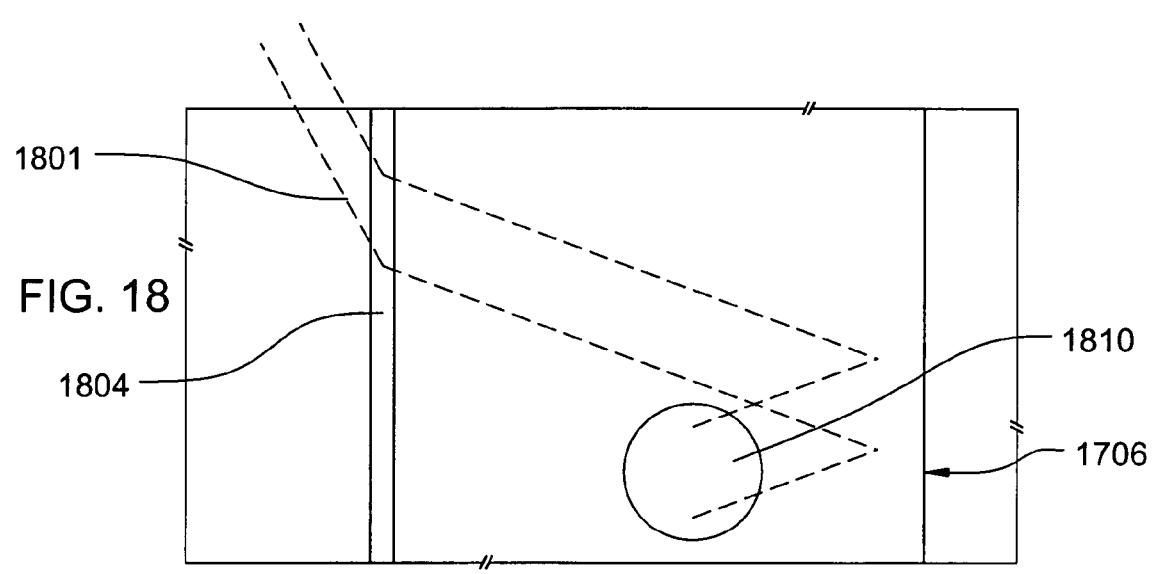
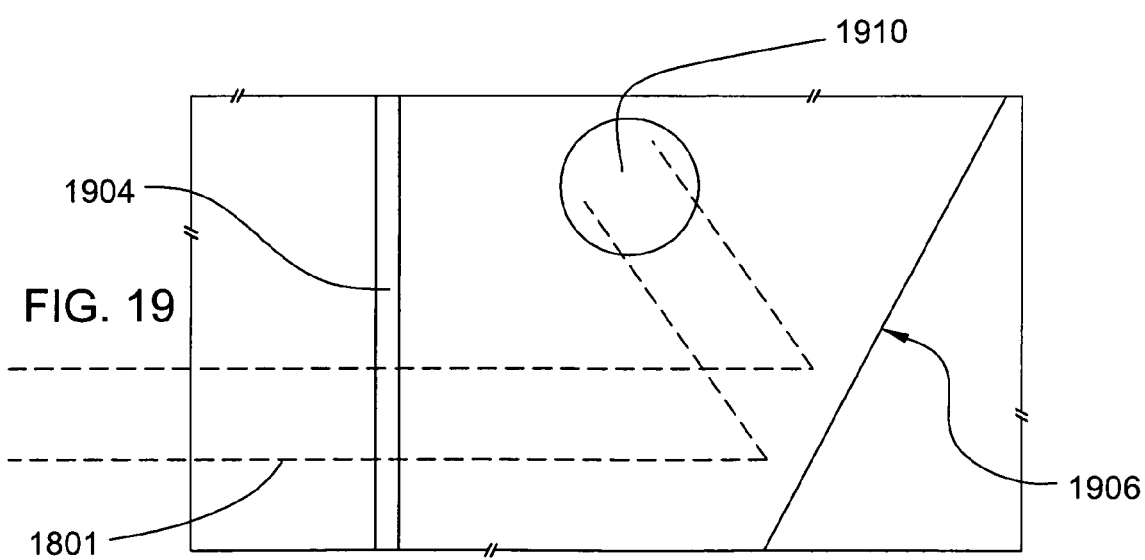

SEMICONDUCTOR PHOTODETECTOR WITH INTERNAL REFLECTOR

RELATED APPLICATIONS

This application is a continuation of U.S. non-provisional application Ser. No. 10/661,709 filed Sep. 12, 2003 (now U.S. Pat. No. 6,992,276), which in turn claims benefit of U.S. provisional App. No. 60/417,805 filed Oct. 10, 2002, said provisional and non-provisional applications being hereby incorporated by reference as if fully set forth herein.

BACKGROUND

The field of the present invention relates to semiconductor photodetectors. In particular, a semiconductor photodetector is described herein that includes an internal reflector.

FIGS. 1A and 1B illustrate a generic configuration including a planar waveguide 120 on a waveguide substrate 101. A surface-mounted photodetector 110 is placed on the waveguide substrate 101 (either directly, or on alignment/support members thereon) for detecting optical power propagating from an output face of waveguide 120. FIGS. 1C and 1D illustrate another generic configuration including an optical fiber 150 received in an alignment groove 152 for illuminating a photodetector 110 (surface-mounted on the groove substrate 151, as in FIGS. 1C and 1D, or fabricated directly on the groove substrate). Reasons for using a photodetector in such circumstances are numerous. For example, the optical power propagating through waveguide 120 or fiber 150 may comprise an optical telecommunications signal modulated at high data rates (10 or more Gbits/sec, for example), and a high-speed photodetector 110 may be employed as a receiver for converting the optical signal into an electronic signal. In another example, the optical power propagating through waveguide 120 or fiber 150 may comprise a portion of the output of a semiconductor laser or other light source split from the main optical output for monitoring purposes. The resulting signal from the photodetector may be used for signal normalization, as a feedback control signal for stabilizing the operation of the light source, and/or for other purposes. In this type of application a high-speed photodetector may or may not be required. Many other circumstances may be envisioned wherein detection of optical power propagating through an optical waveguide or an optical fiber may be useful.

Silicon is a commonly-used planar waveguide substrate, typically provided with a silica buffer layer and one or more silica-based planar waveguides fabricated on the silica buffer layer (so-called Planar Waveguide Circuits, or PLCs). Such substrate may also be readily provided with grooves for receiving an end of an optical fiber. It is often the case (in telecommunications devices) that the wavelength of the optical power carried by waveguide 120 or fiber 150 lies in the 1.3 µm to 1.6 µm region, for which silicon-based photodetectors are not suitable. Photodetectors based on III-V semiconductors are suitable for this wavelength region, but the materials are not compatible for fabrication of the photodetector directly on a silicon or silica surface. Even if waveguide substrate and detector materials are compatible, it may nevertheless be desirable for providing the semiconductor photodetector as a separate component for later assembly for other reasons (incompatible processing steps, design flexibility, customization of waveguide and/or photodetector, and so forth). A separately fabricated semiconductor photodetector 110 (III-V or otherwise) is therefore often assembled onto substrate 101 or 151 (silicon or otherwise) and aligned for receiving and detecting at least a portion of the optical power propagating through waveguide 120 or fiber 150. The present disclosure addresses suitable fabrication and/or adaptation of semiconductor 110 for enabling and/or facilitating such assembly.

For mounting on a substantially planar substrate 101 or 151, it is advantageous for photodetector 110 to also be fabricated/mounted on its own substantially planar substrate. The light to be detected propagates substantially parallel to these planar substrates. However, the layers that form the photodetector active region on the substrate are also substantially parallel to the substrates, rendering absorption and detection of the light by the photodetector problematic in many cases. Redirection of the light out of a plane parallel to the substrates facilitates detection thereof. A photodetector implemented according to the present disclosure employs internal reflection from an angled face of the photodetector substrate for directing the light toward the active region thereof.

SUMMARY

A photodetector comprises a photodetector substrate with angled entrance and reflecting faces formed at the substrate upper surface. The reflecting face forms an acute angle with the substrate upper surface and is positioned relative to the entrance face so that at least a portion of an optical beam transmitted through the entrance face into the substrate is internally reflected from the reflecting face toward the substrate upper surface. A photodetector active region is formed at the substrate upper surface and is positioned so that at least a portion of the optical beam reflected from the reflecting face impinges on at least a portion of the active region.

Large numbers of photodetectors thus formed may be fabricated simultaneously using wafer-scale spatially-selective material processing techniques, which may be implemented by processing only a single wafer surface. Once fabricated (and separated from other photodetectors on the wafer, if wafer-scale processing is employed), a photodetector may be inverted and mounted on a planar waveguide substrate for receiving an optical beam emerging from the end of a planar waveguide formed on the waveguide substrate. At least a portion of the optical beam may enter through the entrance face, reflect from the reflecting face, and impinge on the active region. In this way a photodetector may be readily integrated into a composite optical device assembled on the planar waveguide substrate. Alternatively, the photodetector substrate may be provided with a fiber alignment groove, or may be positioned on a second substrate having a fiber alignment groove, so that light emerging from an end face of an optical fiber positioned in the groove may enter through the entrance face, reflect form the reflecting face, and impinge on the active region.

Objects and advantages pertaining to a semiconductor photodetector with an internal reflector may become apparent upon referring to the disclosed exemplary embodiments as illustrated in the drawings and set forth in the following written description and/or claims.

BRIEF DESCRIPTION OF THE DRAWINGS

FIGS. 1A and 1B are schematic diagrams of a photodetector mounted on a planar waveguide substrate.

FIGS. 1C and 1D are schematic diagrams of a photodetector mounted on a grooved substrate with an optical fiber.

FIGS. 9A and 9B are side and top views, respectively, of a photodetector with an internal reflector.

FIG. 10 illustrates mounting of a photodetector with an internal reflector onto a planar waveguide substrate.

FIGS. 11A and 11B are side and top views, respectively, of a photodetector with an internal reflector.

FIG. 12 illustrates mounting of a photodetector with an internal reflector onto a planar waveguide substrate.

FIG. 13 illustrates mounting of a photodetector with an internal reflector onto a planar waveguide substrate.

FIG. 14 illustrates mounting of a photodetector with an internal reflector onto a grooved substrate with an optical fiber.

FIG. 17 is a top view of a photodetector with an internal reflector.

FIG. 18 is a top view of a photodetector with an internal reflector.

FIG. 19 is a top view of a photodetector with an internal reflector.

It should be noted that the relative proportions of various structures shown in the Figures may be distorted to more clearly illustrate exemplary embodiments. Relative dimensions of various optical devices, optical waveguides, optical components, alignment/support members, electrodes/contacts, and so forth may be distorted, both relative to each other as well as in their relative transverse and/or longitudinal proportions. In many of the Figures the transverse dimension of an optical element is enlarged relative to the longitudinal dimension for clarity, which will cause variations of transverse dimension(s) with longitudinal position to appear exaggerated. Thicknesses of various layers may also be exaggerated.

The embodiments shown in the Figures are exemplary, and should not be construed as limiting the scope of the present disclosure and/or appended claims.

DETAILED DESCRIPTION OF EMBODIMENTS

Figure 2A:
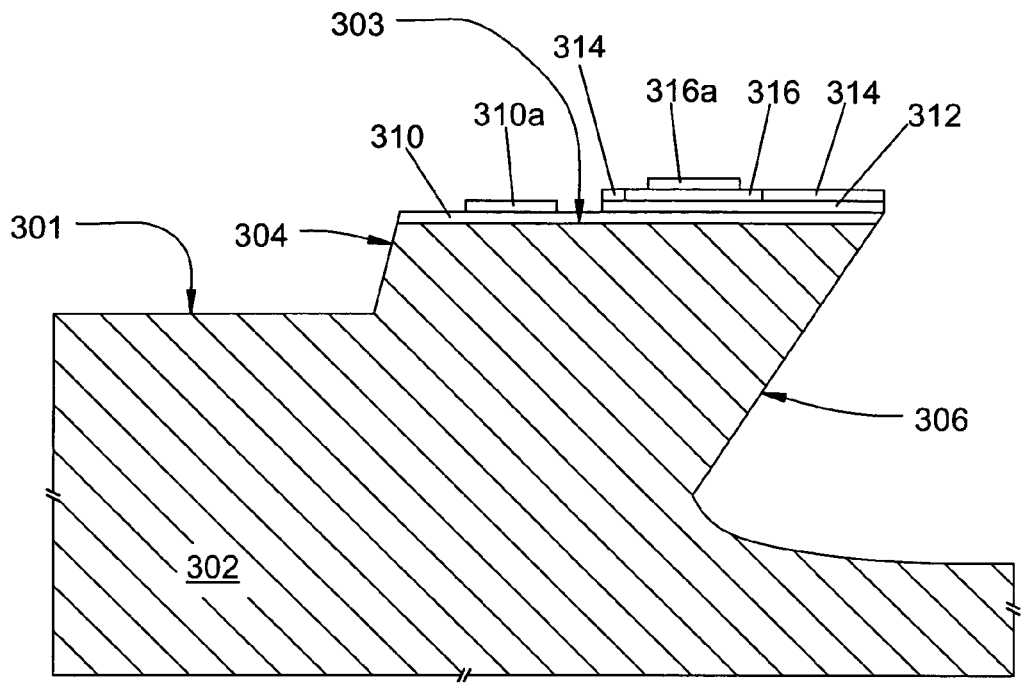
FIGS. 2A and 2B are side cross-sectional and top views, respectively, of a photodetector with an internal reflector.
Figure 2B:
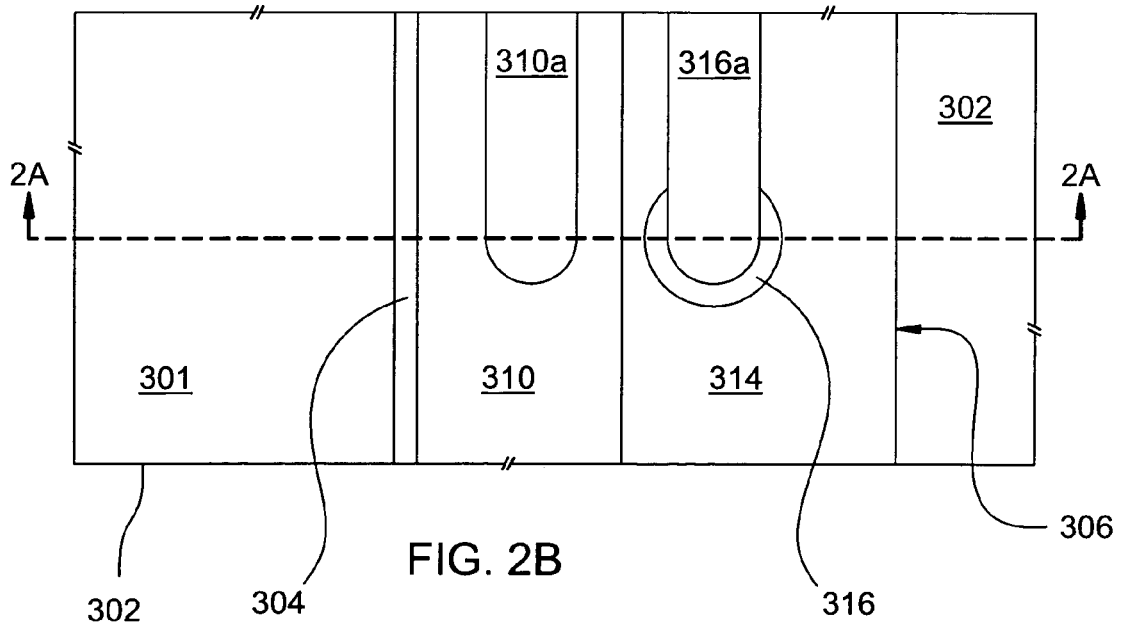
Figure 3A:
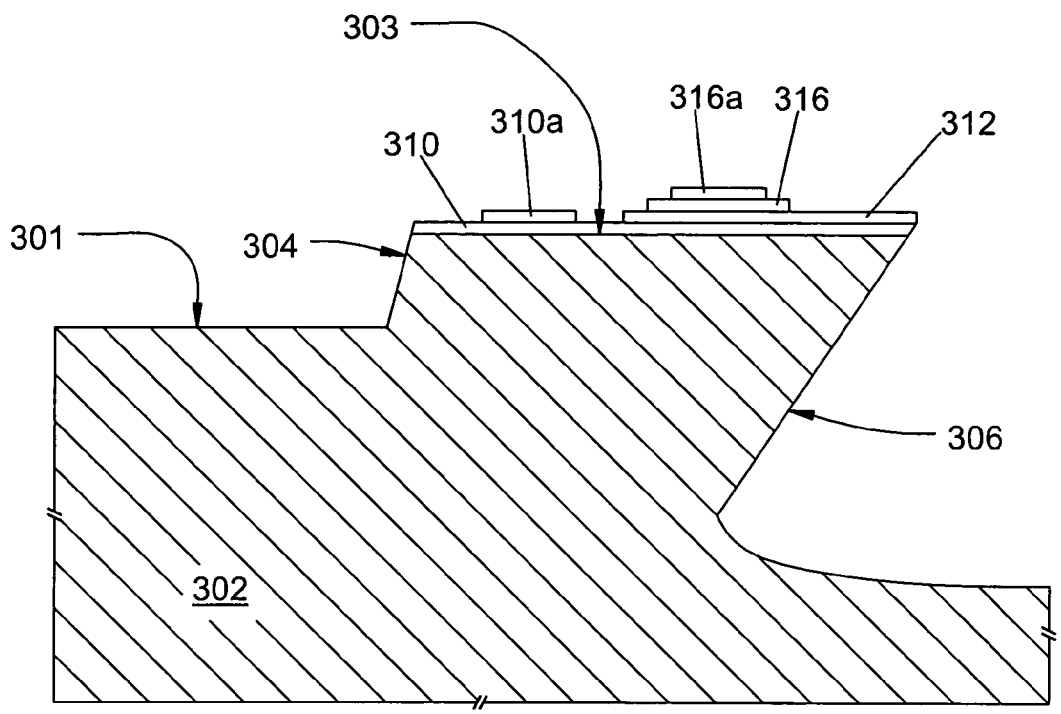
FIGS. 3A and 3B are side cross-sectional and top views, respectively, of a photodetector with an internal reflector.
Figure 3B:
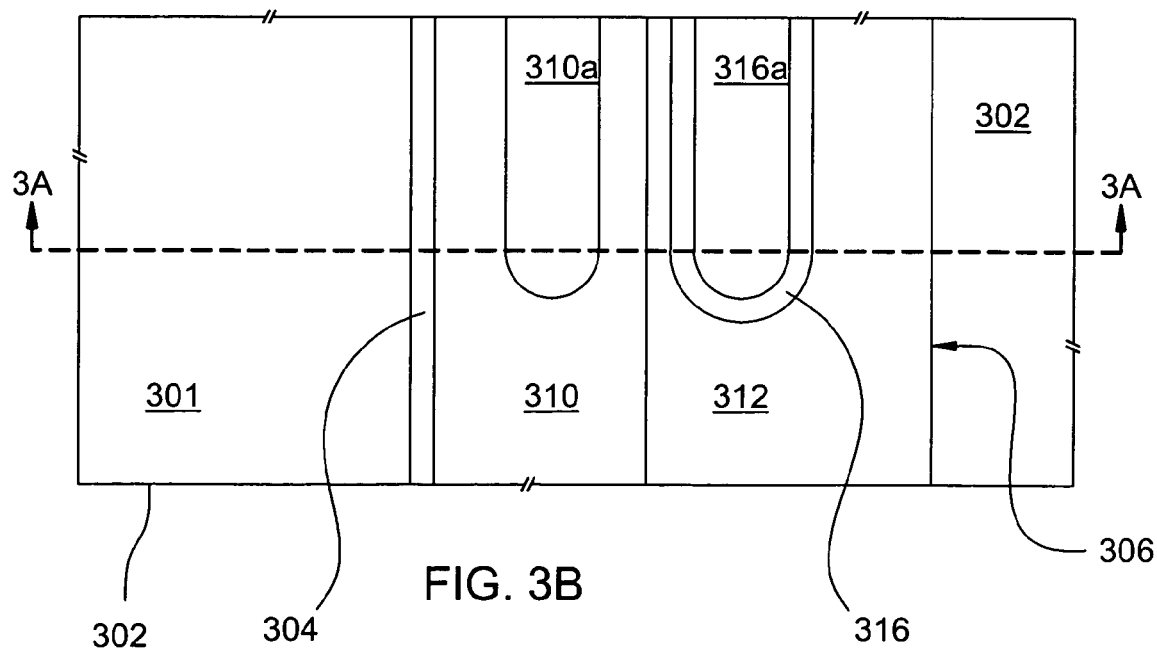

An exemplary photodetector with an internal reflector is shown in FIGS. 2A and 2B. A semiconductor substrate 302 is spatially-selectively processed to form adjacent substrate upper surface areas 301 and 303 at differing heights and separated by an entrance face 304. A reflecting face 306 is formed at the substrate upper surface (bordering area 303) by spatially-selective processing. An n-type semiconductor layer 310 (i.e., an n-layer), an intrinsic semiconductor layer 312 (i.e., an i-layer), and another n-layer 314 are formed at the substrate upper surface area 303. Exemplary materials for producing a III-V semiconductor photodetector are semi-insulating InP or n-type InP for the substrate 302, n-type InP for the n-layers 310 and 314, and InGaAs for i-layer 312. The upper n-layer may be spatially-selectively doped to produce a p-type area 316 (i.e., a p-layer). Alternatively, a p-layer layer may be initially present (instead of n-layer 314) and spatially-selectively etched to form p-layer area 316 (as shown in FIGS. 3A and 3B). Layers 310, 312, and 316 from a p-i-n junction that functions as the photodetector active region. Metal contact layers may be applied, for example contact 310a formed on an exposed portion of n-layer 310, and contact 316a formed on p-layer 316, thereby providing co-sided contacts to the p-i-n photodetector. Alternatively, an n-type substrate may be employed, and contact 310 applied to the opposite side of the substrate 302. Incident optical power may enter the substrate through entrance face 304 and propagate through a portion of substrate 302, and at least a portion of the incident optical power may be internally reflected from reflecting face 306 to impinge on at least a portion of the photodetector active region, generating an electronic signal.

Any suitable type of photodetector active area may be formed while remaining within the scope of the present disclosure and/or appended claims. Examples may include but are not limited to p-i-n photodiodes (photoconductive or photovoltaic), avalanche photodiodes, Schottky diodes, phototransistors, metal-semiconductor-metal (MSM) photodetectors, combinations thereof, and/or functional equivalents thereof. Any suitable semiconductor material or material combinations may be employed while remaining within the scope of the present disclosure and/or appended claims. Examples may include, but are not limited to: silicon and/or silicon-based semiconductors; germanium and/or germanium-based semiconductors; III-V semiconductors and/or alloys thereof; n-doped and/or p-doped variants thereof; combinations thereof; and/or functional equivalents thereof.

The entrance face 304 may form an angle varying over a wide range depending on the desired optical configuration for the photodetector. Many useful optical configurations may be implemented with an angle α between about 60° and about 120°, and typical configurations may employ an angle α between about 85° and about 110°. Angles between about 85° and about 110° between the entrance face 304 and the substrate upper surface areas 301 and 303 yield incidence angles from about 5° (reflecting face surface normal below horizontal) through 0° (normal incidence) to about 20° (reflecting face surface normal above horizontal), for light propagating substantially parallel to the adjacent substrate surface areas 301 and 303. Other incident propagation directions may be accommodated while remaining within the scope of the present disclosure and/or appended claims. The entrance face may be formed by a dry etch process (such as reactive ion etching) that enables control of the vertical angle and horizontal orientation of the resulting etched face. Other etch processes allowing the angle to be chosen may be employed, or it may be possible for a given substrate material and crystal orientation to make use of etching along crystal planes in the material to achieve the desired entrance face angle. A saw cut or other mechanical material processing techniques could instead be employed for forming entrance face 304. Regardless of the processing employed for forming entrance face 304, in some cases subsequent processing may result in absence of substrate upper surface area 301 from the finished photodetector, while in other cases the finished photodetector may include at least a portion of substrate upper surface area 301. An entrance face 304 oriented along a crystal plane may alternatively be formed by cleaving the substrate, which would also eliminate substrate surface area 301 from the finished photodetector.

Figure 4:
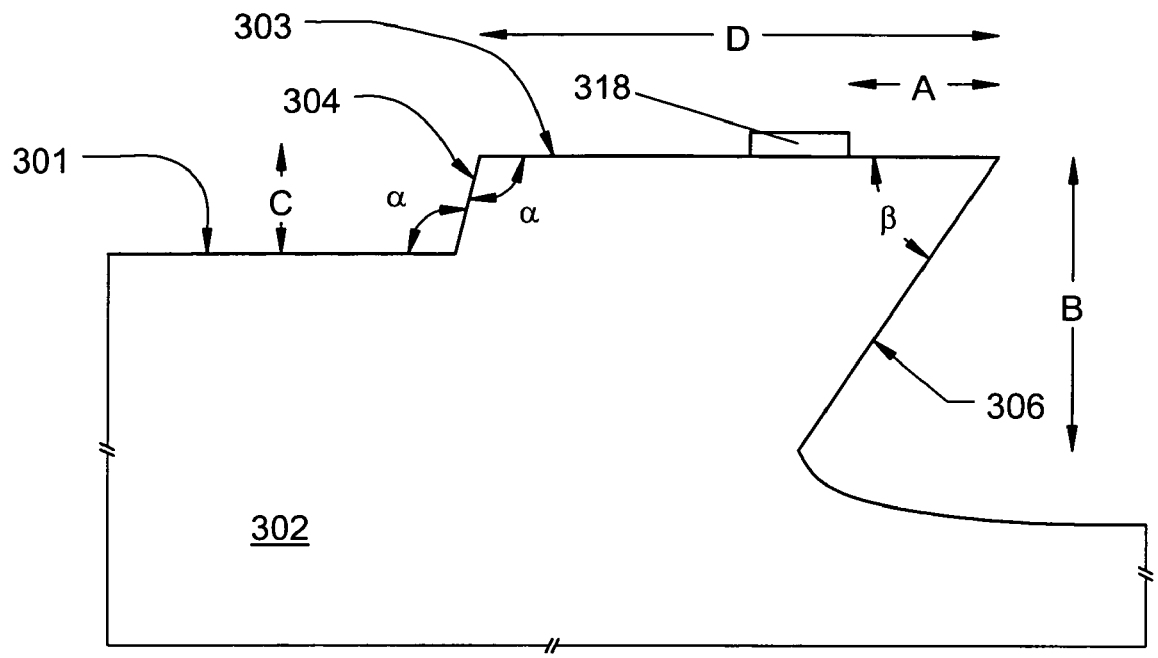
FIG. 4 is a side view of a photodetector with an internal reflector.

For an InP substrate (n≈3.2) in air and an incident beam propagating substantially parallel to substrate surface areas 301 and 303, the stated range of entrance face orientations leads to a range of refracted angles from about 2° above horizontal through 0° to about 14° below horizontal. For refraction below horizontal, the refracted beam directed deeper into the substrate, away from the adjacent substrate upper surface area 303 and away from the photodetector active region (active region labeled 318 in FIG. 4). For an InP substrate embedded in a typical transparent "potting" or encapsulating medium (n≈1.4–1.5, for example), the refracted optical beam forms an angle ranging between about 2.3° above horizontal and about 11° below horizontal. The entrance face 304 may be antireflection coated to decrease reflective losses and/or reduce optical feedback to upstream optical devices or components (about 27% reflection at an uncoated InP/air interface; about 14% at an uncoated InP/encapsulant interface). Non-normal incidence at entrance face 304 may also serve to reduce optical feedback to upstream optical devices or components arising from reflection from the entrance face. If the photodetector is to be used in a multi-wavelength optical system or assembly, a wavelength-selective filter coating of any suitable type may be formed on the entrance face, such as a long-pass, short-pass, bandpass, or notch filter.

Reflecting face 306 may be formed by a spatially-selective etch process. A wet etch process may be employed for forming reflecting face 306, which forms along a crystal plane of the substrate material. For InP (crystallographic 100 surface substantially parallel to the substrate surface), the reflecting face 306 forms at an angle between about 51° and about 60° (usually about 55°) with the substrate surface (angle β of FIG. 4), so that an optical beam refracted at entrance face 304 (as described above) and propagating within the substrate may be internally reflected upward toward the photodetector active region 318 at the substrate surface. For other crystal orientations and/or other substrate materials, reflecting face 306 may form along a crystal plane at another angle. Use of a crystal plane for defining reflecting face 306 results in a reproducible face orientation and a reflecting surface of high optical quality. Alternatively, reflecting face 306 may be formed by any other suitable spatially-selective etch process(es), including dry etch processes, that form the reflecting face at an angle determined by the crystallographic structure of the substrate, or that may form the reflecting face at any desired angle. A saw cut or other mechanical material processing techniques could instead be employed for forming reflecting face 306. The angle between reflecting face 306 and the substrate upper surface area 303 may typically range between about 40° and about 70°, may more typically range between about 45° and about 65°, and may range between about 51° and about 60° for many common photodetector implementations.

Dimensions for a photodiode with an internal reflector may be subject to a variety of practical constraints. The following are exemplary dimensions that may be used for implementing an InP-based photodetector with an internal reflector, but should not be interpreted as limiting the scope of inventive concepts disclosed and/or claimed herein. A primary constraint is the minimum distance between an edge of the photodetector active region 318 and the edge of the etched reflecting face 306 (dimension A in FIG. 4). Performance of the photodetector may degrade if the photodetector active region is too close to the etched edge (less than about 5–7 μm away for a p-i-n photodetector on InP; this may depend on material quality and/or processing quality control), with such detectors potentially exhibiting poor reliability and/or high dark currents. For a substantial portion of the optical beam to reach the photodetector active region at this position (i.e., at least 5–7 μm away from the reflector edge), an upper portion of the optical beam should reflect from reflecting face 306 at a depth greater than a minimum depth within photodiode substrate 302. This minimum depth also depends on the angle of the reflecting face. For InP with a reflecting face between about 51° and about 60°, the depth of an upper portion of the reflected optical beam may typically be greater than about 5–7 μm. To accommodate this distance and typical beam sizes/divergences encountered (see below), the overall etch depth for reflecting face 306 (dimension B in FIG. 4) should in most cases be greater than about 10 μm, and is typically between about 30 μm and about 50 μm. The size and/or position of the incident optical beam may force this minimum etch depth to be made larger. There may also be a practical upper limit for this etch depth, however. The InP photodetector substrate 302 may typically be thin (perhaps as thin as about 150 μm or less). The depth of the reflecting face etch should not be too large a fraction of this overall thickness, so as too avoid excessive weakening of the substrate, and potential device failure. Larger etch depths may also require larger areas of the substrate to be masked, decreasing the density of devices that may be fabricated on a single substrate wafer. The etch depth of a wet etch may typically be controlled by etchant concentration and etch time, although other techniques may be employed (see below) for controlling the depth of wet etch, dry etch, or other processes used for providing reflecting face 306.

On the input side, the entrance face 304 should be etched at least deeply enough below the level of photodetector active area 318 (dimension C in FIG. 4) to accommodate (both in terms of size and position) an optical mode transmitted through the entrance face 304. An optical mode supported by a planar waveguide with a relatively small and/or transversely asymmetric core may be only a few μm across upon exiting the waveguide and exhibit correspondingly large beam divergence. The fraction of such a divergent optical beam entering entrance face 304 may therefore be limited unless the entrance face is sufficiently close to the waveguide end face or sufficiently large to accommodate the divergent optical beam farther from the waveguide end face. Alternatively, a larger and correspondingly less divergent optical mode may emerge from the end of a planar waveguide or an optical fiber; such larger modes do not typically exceed about 10 μm in transverse extent. The entrance face in this instance should be sufficiently large to accommodate the optical mode, which may not vary much over the distance between the waveguide end face and entrance face 304. The depth of the entrance face 304 may be limited by the etching processes employed and/or by geometric constraints of the planar waveguide substrate (for example if the entrance face must be positioned facing the end of the planar waveguide while contacts on the photodetector make contact with the waveguide substrate). A minimum etch depth for forming the entrance face 304 may be about 5 μm (suitable for a small optical mode emerging from a waveguide close to the entrance face, for example), while more typical photodetectors may be fabricated with the entrance face etched to a depth between about 30 μm and about 50 μm. An optical beam transmitted through the entrance face 304 (once the photodetector has been mounted on a second substrate with a planar waveguide or fiber) is typically centered on the entrance face between about 2.5 µm and about 50 µm below the level of active area 318, often between about 10 µm and about 25 µm below the level of the active area. Other etch depths for the entrance face and other positions for the transmitted optical beam on the entrance face may be employed while remaining within the scope of the present disclosure and/or appended claims. It should be noted that the upper edge of the entrance face may or may not coincide with the level of the active area in the finished photodetector, depending on the particular spatially selective material processing employed to form the entrance face, reflecting face, and active area.

The angle of the entrance face 304 (angles α in FIG. 4), the distance along the substrate upper surface between the upper edges of entrance face 304 and reflecting face 306 (dimension D in FIG. 4), and the angle of the reflecting face (angle β in FIG. 4) together determine the position on reflecting face 306 from which the optical beam is reflected. The angle α of entrance face 304 for an exemplary photodetector may range between about 95° and about 99°, resulting in an angle of incidence on the reflecting face between about 29° and about 33° for a reflecting face angle β of about 55°. These incident angles are above the critical angle for total internal reflection (about 18° for an air/InP interface; about 27° for an encapsulant/InP interface), and result in a depth change at reflecting face 306 of about 5%–10% of the face-to-face distance. To achieve a minimum depth of at least 5–7 µm at the reflecting face (as discussed above), an optical beam may be transmitted through the entrance face at a depth greater than or equal to about 5–7 µm, or a smaller entrance face depth may be accommodated by a sufficiently large face-to-face distance. Larger entrance face depth and/or larger face-to-face distances result in greater reflecting face depth. There may be an upper limit on the entrance face depth (as described above), and there may be an upper limit on the face-to-face distance (less than about 250 µm, for example) by the divergence of the optical beam, the sensitivity/speed demands placed on the photodetector, size constraints on the photodetector, and any processing limits on the etch depth for reflecting face 306 (discussed above). Many typical photodetectors may have a face-to-face distance between about 50 m and about 250 µm; distances outside this range may nevertheless fall within the scope of the present disclosure and/or appended claims.

Smaller face-to-face distances may be required when detection efficiency is at a premium. Such may be the case: when the optical beam is more divergent; when the incident optical signal power is small; when a high-speed [10 Gbit/sec or more], and therefore smaller area, photodetector is called for; and so forth. A smaller face-to-face distance results in a larger fraction of the optical beam impinging on the active region of the photodetector, improving overall detection efficiency of the photodetector. In applications where detection efficiency may not be so critical (less divergent beam, low-speed detection, larger active area, large optical signal power, etc), larger face-to-face distance may be employed, potentially relaxing fabrication tolerances and/or improving device yields (for example, if the active photodetector region 318 need not be quite so close to etched reflecting face 306).

An exemplary photodetector may comprise an InP substrate with a p-i-n active area, with an active area about 15 µm wide and about 24 µm long, with about a 12 µm gap between the active area and the reflecting face edge. The reflecting face angle (β) may be about 55°, and the face-to-face distance is about 100 µm. The entrance face angle (α) may range between about 95° and about 99°, and the entrance face depth (between the active area level and the center of an optical beam transmitted through the entrance face) may be about 13.5 µm for an non-encapsulated photodetector, or about 15.5 µm for an encapsulated photodetector. The corresponding reflecting face depth (between the active region level and the center of the internally-reflected optical beam) may be about 18 µm for a non-encapsulated photodetector and about 20 µm for an encapsulated photodetector.

It should be noted that various processing steps or sequences may not produce a sharp or well-defined edge or angle between the substrate upper surface and entrance face 304 or reflecting face 306. In some cases the edges may be unintentionally rounded or curved, or protruding or overhanging material may be left at the edge, a protruding "foot" may be left at the base of an etched face, and/or other irregularities may be left after processing. In other cases one or both of the faces may not meet the substrate upper surface by design. The angles between surfaces and faces referred to herein shall be angles between those portions of the surface or face where the intended geometry has been achieved (e.g., substantially flat portions of a flat entrance face), regardless of whether the surfaces and faces actually meet. Similarly, the face-to-face distances referred to hereinabove shall be measured between locations where the intended surfaces or faces would have met in the absence of irregularities at the edges or processing that eliminated the edges.

It should be noted that while total internal reflection from reflecting face 306 is desirable for increasing the overall detection efficiency of the photodetector and reducing polarization-dependence of the face reflectivity, angles below the critical angle, and therefore resulting in only partial, polarization-dependent internal reflection, may nevertheless fall within the scope of the present disclosure and/or appended claims. In instances where absolute collection efficiency may not be a critical issue, a photodetector with an internal reflector may be implemented with only partial internal reflection from reflecting face 306. In addition, divergent optical beams propagating within the photodetector and reflected from the reflecting face may undergo total internal reflection over only a portion of the divergent beam if the range of incident angles straddles the critical angle. Portions of extremely divergent input optical beams may even impinge directly on the photodetector active area, without undergoing internal reflection. A reflective coating of any suitable type may be formed on reflecting face 306 to enhance internal reflection therefrom at any desired angle of incidence, at the expense of extra processing steps for applying the coating. Examples of such reflective coatings may include metal reflector coatings and multi-layer dielectric reflector coatings.

Figure 5A:
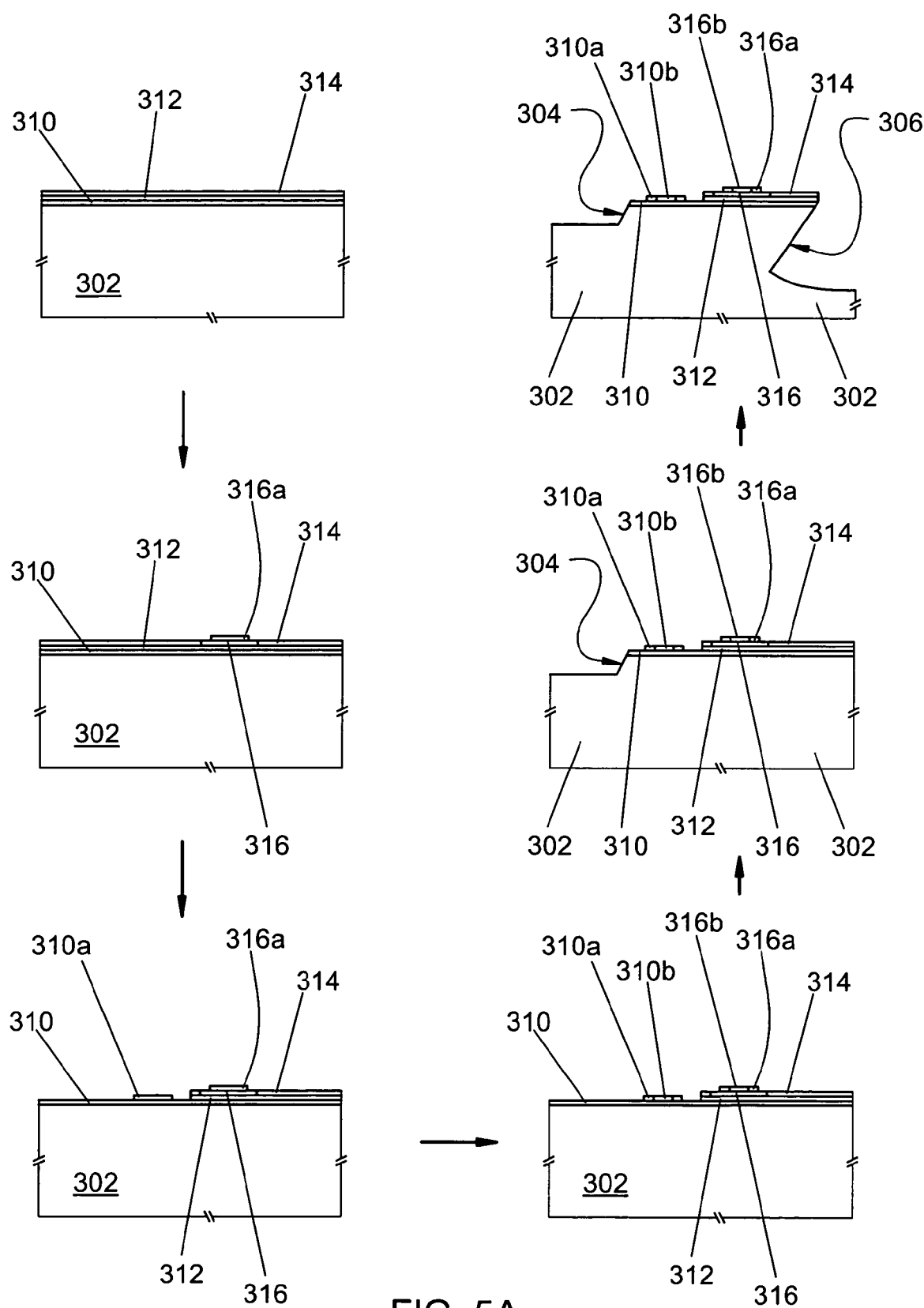
FIGS. 5A and 5B are side and top views, respectively, illustrating a process sequence for fabricating a photodetector with an internal reflector.
Figure 5B:
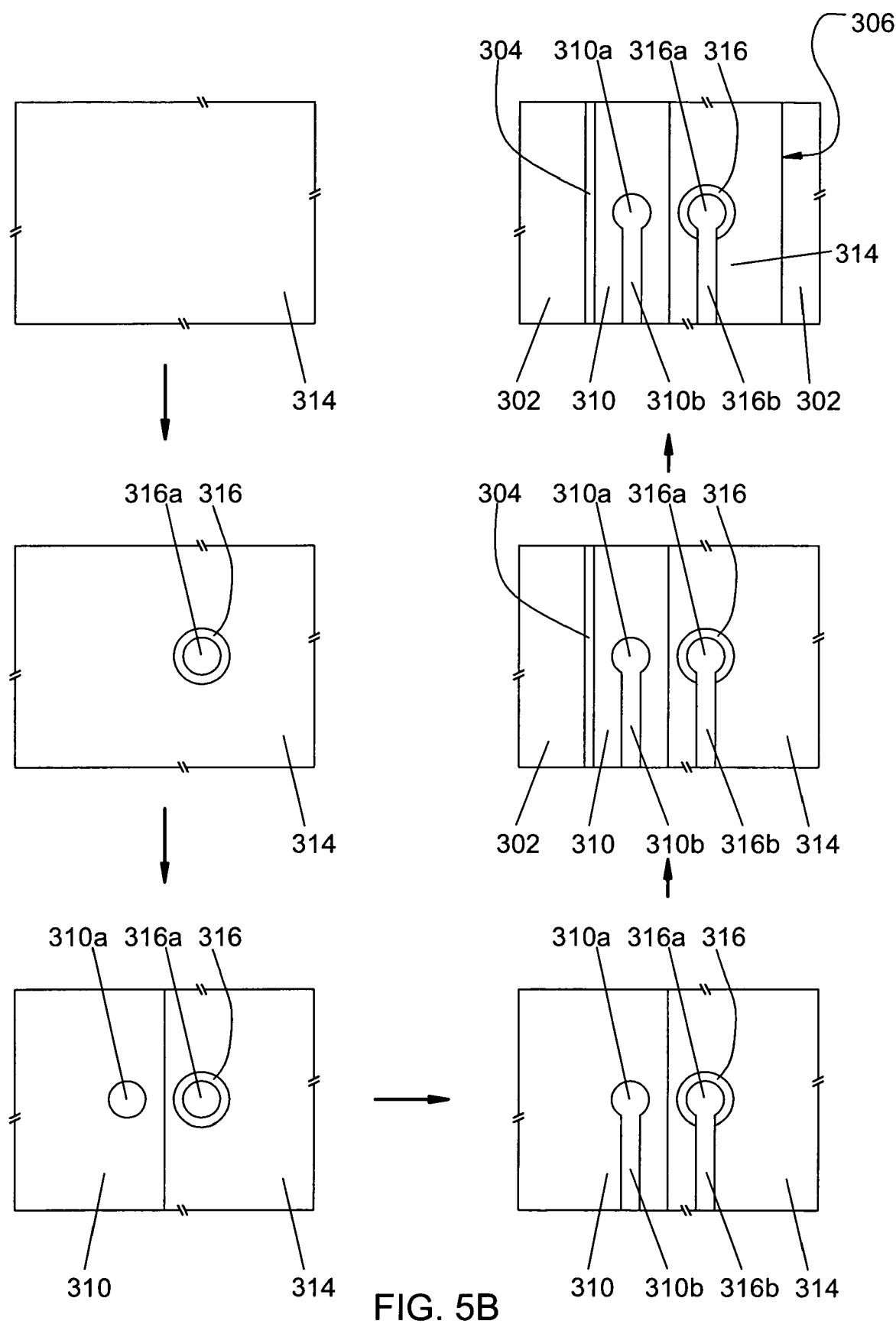

A photodetector with an internal reflector may be fabricated by the following exemplary sequence of spatially selective process steps (side view in FIG. 5A, top view in FIG. 5B). Substrate 302 may comprise semi-insulating InP, layers 310 and 314 may comprise n-type InP, and layer 312 may comprise a layer of semi-insulating or lightly doped InGaAs. Masked diffusion of a p-type dopant may be employed to form p-type area 316, which may then be provided with a metal contact layer 316*a*. While protecting contact 316*a* and p-type area 316, a portion of n-type layer 314 and layer 312 may be removed and a metal contact 310*a* may be deposited on an exposed portion of n-type layer 310. Electrical access is thus provided for both p-type and n-type layers 310 and 316, which with intervening layer 312 form a p-i-n photodetector active region. Metal electrical traces 310b and 316b may be deposited for enabling electrical access to contacts 310a and 316a, respectively. Masked dry etching may be employed for forming entrance face 304 at the desired angle, and masked wet etching may be employed for providing the reflecting face 306 (each while protecting contacts and traces, if formed before etching of entrance and/or reflecting faces). All processing steps for forming the photodetector as well as the entrance and reflecting faces may be performed on a single semiconductor substrate surface, eliminating a need for processing both semiconductor surfaces and thereby significantly reducing processing complexity and expense. The exemplary processing sequence also yields a photodetector having co-sided contacts, which may be advantageous in some instances. The process sequence may be implemented on a wafer-scale substrate for many photodiodes simultaneously. Once the processing steps are completed, the wafer may be divided into separate devices for deployment and use. Many other material combinations, layer thicknesses, and/or processing sequences may be devised and employed for fabricating a photodetector active region of any suitable type that nevertheless falls within the scope of inventive concepts disclosed and/or claimed herein.

In order to reproducibly achieve proper positioning of a wet-etched reflecting face 306, care must be taken that the etching process does not undercut the mask used to define the edge of the reflecting face at the surface of the substrate. Only if there is little or no undercutting of the mask by the etch process will the reflecting face end up in the intended position with high optical quality substantially all the way up to the substrate surface. If the mask does not adhere sufficiently well to the substrate and undercutting occurs, the reflecting face will end up too close to entrance face 304 and the photodiode active region (Dimensions C and D from FIG. 4 too small). This may spoil the geometry of the optical path within the photodetector substrate and decrease the fraction of incident light that reached the photodetector active region. Insufficient distance between the photodetector active region and the etched edge of reflecting face 306 may degrade the performance of the photodetector. In the particular example of FIGS. 2A/2B, 3A/B, and 5A/5B, the properties of the materials employed may be exploited for mitigating this potential fabrication problem. The starting material for the processing sequence may typically include an InP substrate with n- and/or p-doped InP layers 310 and 314 with an InGaAs intrinsic layer 312 therebetween. These layers are typically epitaxially grown and are in intimate, atomic level contact with one another (interface typically one or only a few monolayers thick). The InGaAs layer therefore may function as an ideal mask material for a wet etch to provide reflecting surface 306. Layers 310/314 and InGaAs layer 312 may be spatially selectively removed from the substrate along a boundary corresponding to the desired upper edge of reflecting face 306. The InGaAs layer is impervious to the etch and protects and constrains the upper edge of the reflecting face as the InP substrate is etched along a crystallographic plane. The specific examples of substrate, etchant, and mask material(s) are exemplary. Any mask that suitably adheres to the substrate material, and any etchant that exhibits the desired crystal plane selectivity, may be equivalently employed.

Figure 6A:
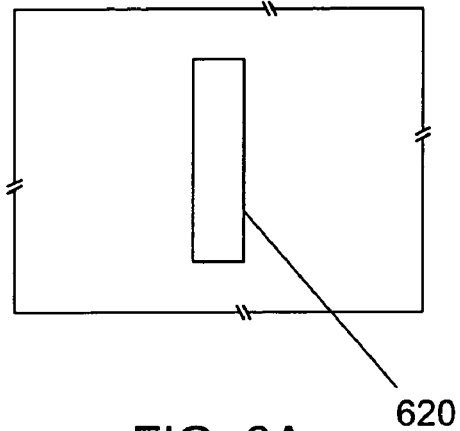
FIGS. 6A, 6B, 6C, and 6D illustrate a process step for fabricating a photodetector with an internal reflector.
Figure 6B:
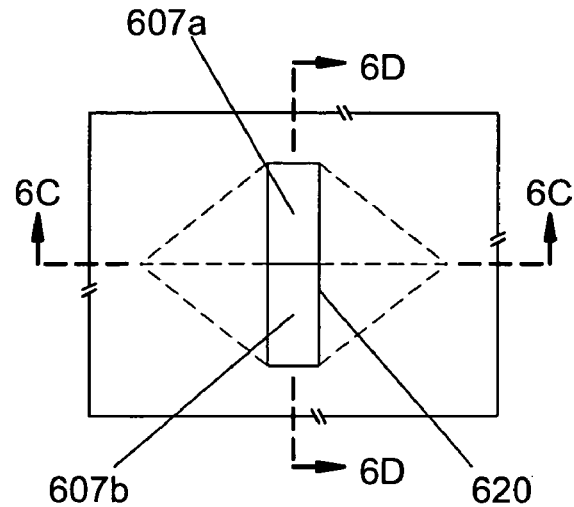
Figure 6C:
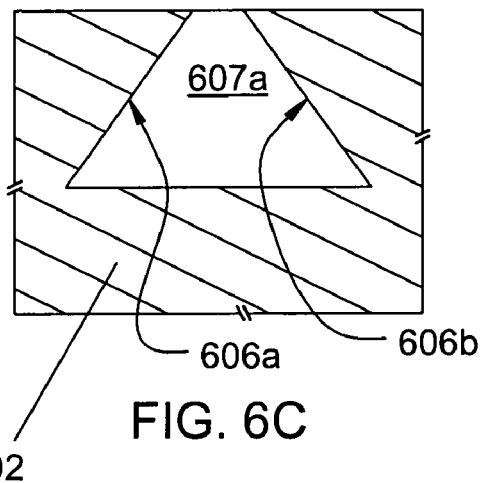
Figure 6D:
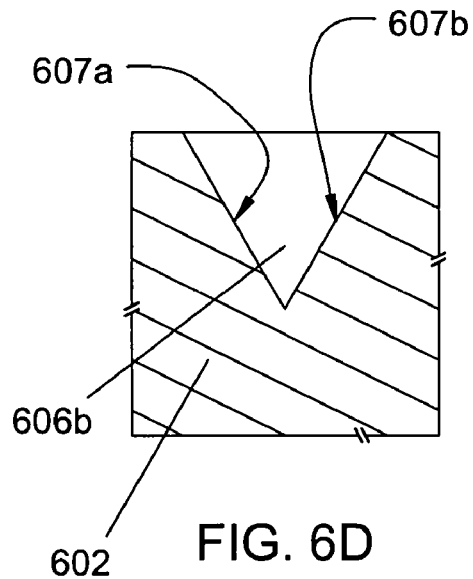

If a spatially selective wet etch is employed that etches selectively along two crystallographic planes, then the dimensions of a de-masked area may be used to determine the size (including the depth) of the wet etch. For example, In FIG. 6A a rectangular area 620 is de-masked. An etchant is used that selectively etches along two different crystallographic planes of substrate 602 (for example, aqueous HBr/H3PO4 applied to an InP (100) surface selectively etches along the (111a) and (111b) crystal planes; other etchant/crystal combinations may similarly exhibit such dual selectivity). FIGS. 6B, 6C, and 6D show the results of the doubly selective etch process. A tetrahedral cavity is etched into the substrate 602 with surfaces 606a and 606b inclined under the substrate surface and each therefore able to serve as an internal reflecting face of a photodetector. Surfaces 607a and 607b slope toward each other, and when they meet the etch process terminates (regardless of continued exposure to the etchant). The overall depth of the etch process and the precise position and dimensions of the reflecting faces are therefore determined only by the initial dimensions and position of de-masked area 620, which may be determined accurately and precisely. The specific examples of substrate, etchant, and mask material(s) are exemplary. Any mask that suitably adheres to the substrate material, and any etchant that exhibits the desired crystal plane selectivity, may be equivalently employed.

Figure 7A:
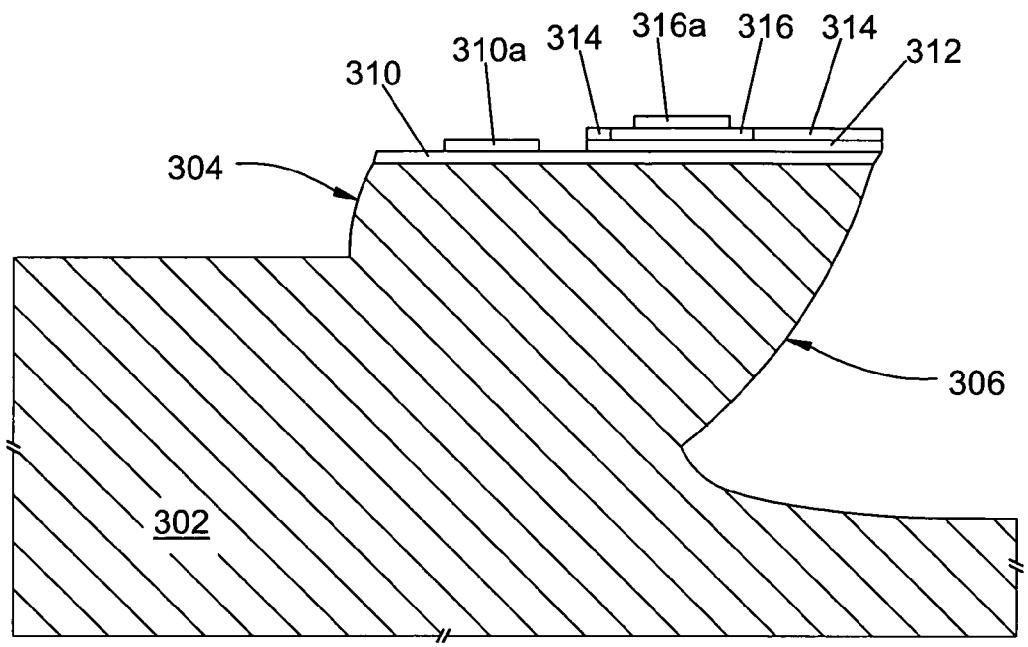
FIGS. 7A and 7B are side and top views, respectively, of a photodetector with an internal reflector.
Figure 7B:
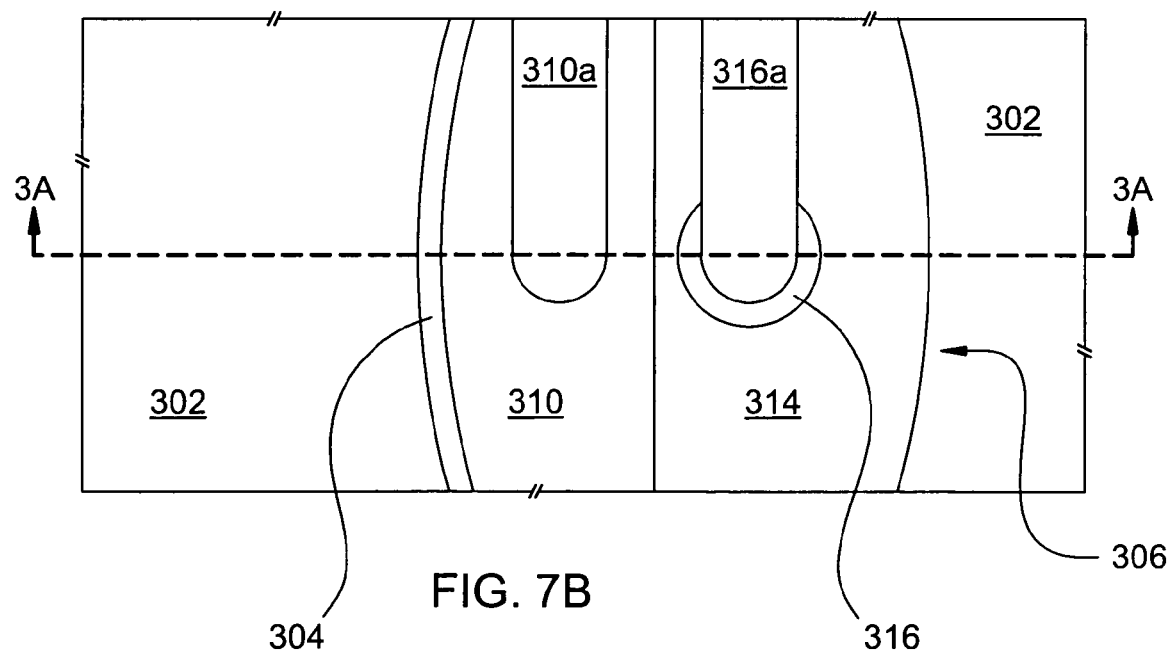

Entrance face 304 and/or reflecting face 306 may be suitably curved (in one or both dimensions) for reducing the divergence of an incident optical beam. Entrance face 304 may be readily provided with a lateral curvature (as in FIG. 7A) to form a convex refracting surface by suitable alteration of whatever spatially-selective etch process is employed for its formation. For example, if formed by a masked etching process, suitable modification of the mask may provide the desired lateral curvature for entrance face 304. Providing a vertical curvature for entrance face 304 may pose a more challenging fabrication problem, but may nevertheless be employed for reducing the divergence of an incident optical beam in the vertical dimension (as in FIG. 7B). Techniques such as gray-scale lithography, for example, may yield a desirable vertical curvature for forming a convex refracting surface for entrance face 304. A suitably curved surface may be provided in a similar manner for reflecting face 306, forming a concave internal reflection surface for reducing the divergence of an optical beam propagating from entrance face 304. Providing lateral curvature for reflecting face 306 may be readily achieved by suitable adaptation of the relevant spatially selective processing steps (altering a mask, for example), while providing vertical curvature may be more problematic (particularly since reflecting face 306 is recessed relative to the surface of the substrate). Use of an etching process restricted to crystallographic surfaces would not be suitable for providing a curved reflecting face 306. Use of laterally and/or vertically curved entrance and/or reflecting faces may reduce the divergence of an incident optical beam; may increase the fraction of an incident beam that impinges on the photodetector active area; may enable use of longer face-to-face distances; may enable use of smaller, faster, and/or less efficient photodetectors; may loosen alignment tolerances between the photodetector and the optical waveguide or fiber providing the incident optical beam.

Figure 8:
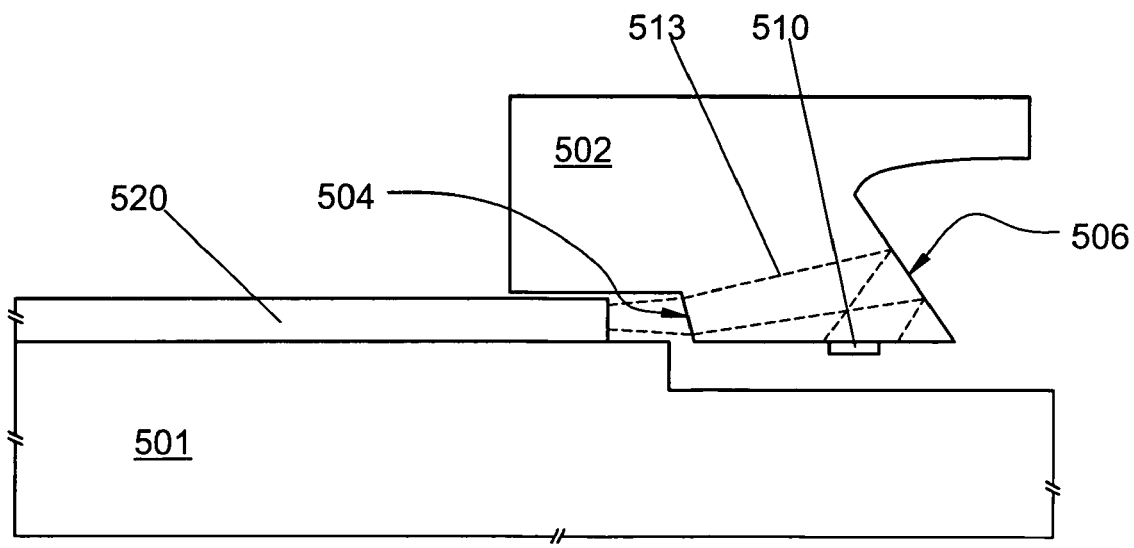
FIG. 8 illustrates mounting of a photodetector with an internal reflector onto a planar waveguide substrate.

Once fabricated and separated from other photodetectors on the wafer, a photodiode fabricated with an internal reflector may be inverted and mounted for receiving light emitted from the end of a planar waveguide on a substrate (i.e., "flip-chip" mounted onto a PLC waveguide, as in the example of FIG. 8). The substrate 501 may be provided, if necessary, with a pocket or depression for accommodating any portion of the photodetector that may extend below the level of the planar waveguide 520. A planar waveguide 520 on waveguide substrate 501 is adapted at the end thereof for emitting light propagating therethrough. The emerging optical beam diverges as it propagates from the end of the waveguide according to the mode size supported by the waveguide. The output end of the waveguide may be adapted for mode expansion so as to decrease the divergence of the output beam. The optical beam 513 may propagate substantially parallel to the waveguide substrate and enter the photodetector through entrance face 504. After refraction at the entrance face 504, the beam is redirected to propagate deeper into the photodetector substrate 502 (upward in FIG. 8, since the photodetector is inverted). The optical beam is internally reflected from reflecting face 506 and directed toward photodetector active region 510.

Not shown in the Figures are alignment/support structures that may be fabricated on waveguide substrate 501 and/or photodiode substrate 502 for facilitating proper placement of the photodetector in waveguide substrate 501 substantially aligned with the end of waveguide 520 (so that an optical beam emerging from the waveguide illuminates at least a portion of the photodetector active area). Such support/alignment structures may include grooves, flanges, posts, tabs, slots, yokes, solder/metal surface tension, and the like for guiding placement of the photodetector on the waveguide substrate. Waveguide substrate 501 may be provided with electrodes, contacts, and/or electrical traces for establishing electrical connections to the photodetector (omitted from the Figures for clarity). Contacts may be incorporated into support/alignment structures, or may comprise separate structures. Solder or other material employed for forming electrical connections between contacts on the photodetector and mating contacts on the waveguide substrate may also serve to mechanically bond the photodetector to the substrate. Alternatively, the photodetector may be mechanically bonded to the waveguide substrate by a suitable adhesive.

Figure 15:
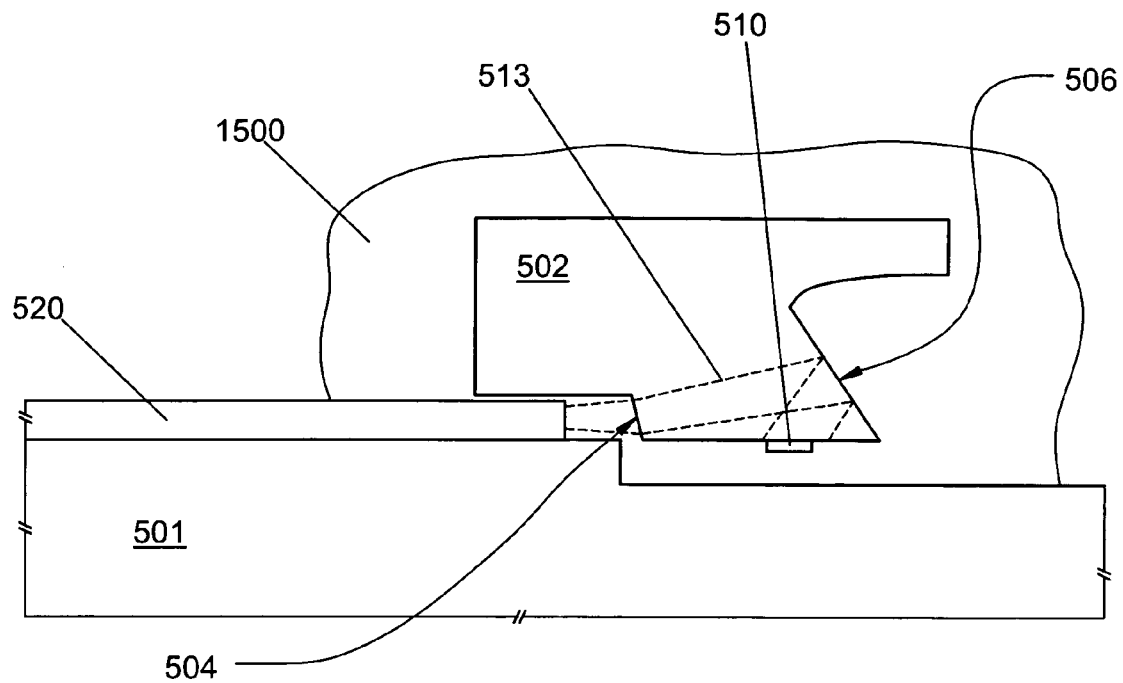
FIG. 15 illustrates mounting of a photodetector with an internal reflector onto a planar waveguide substrate.

A substantially transparent embedding medium or encapsulant 1500 may substantially fill the optical path between the end of planar waveguide 520 and entrance face 504 of the photodetector (FIG. 15). Such a substantially transparent embedding medium may serve to reduce unwanted reflection from the end face of the planar waveguide and from photodetector entrance face 504. The embedding medium may have an refractive index near the refractive index of one of the photodetector and planar waveguide, or between them. Any suitable embedding medium or encapsulant (substantially transparent over a desired operating wavelength range) may be employed that reduces reflection at the waveguide end face and photodetector entrance face relative to vacuum or ambient air. The embedding medium 1500 may be spatially-selectively applied between the waveguide end face and photodetector entrance face, or may instead serve to encapsulate the photodetector and the adjacent end portion of the planar waveguide, as in FIG. 15. Encapsulation of internal reflecting face 506 increases the critical angle for total internal reflection, which, if total internal reflection is desired for the photodetector, may impose tighter ranges and/or tolerances for angular and linear dimensions of the photodetector, and may also impose tighter ranges and/or tolerances for size and divergence of an incident optical beam.

Figure 16:
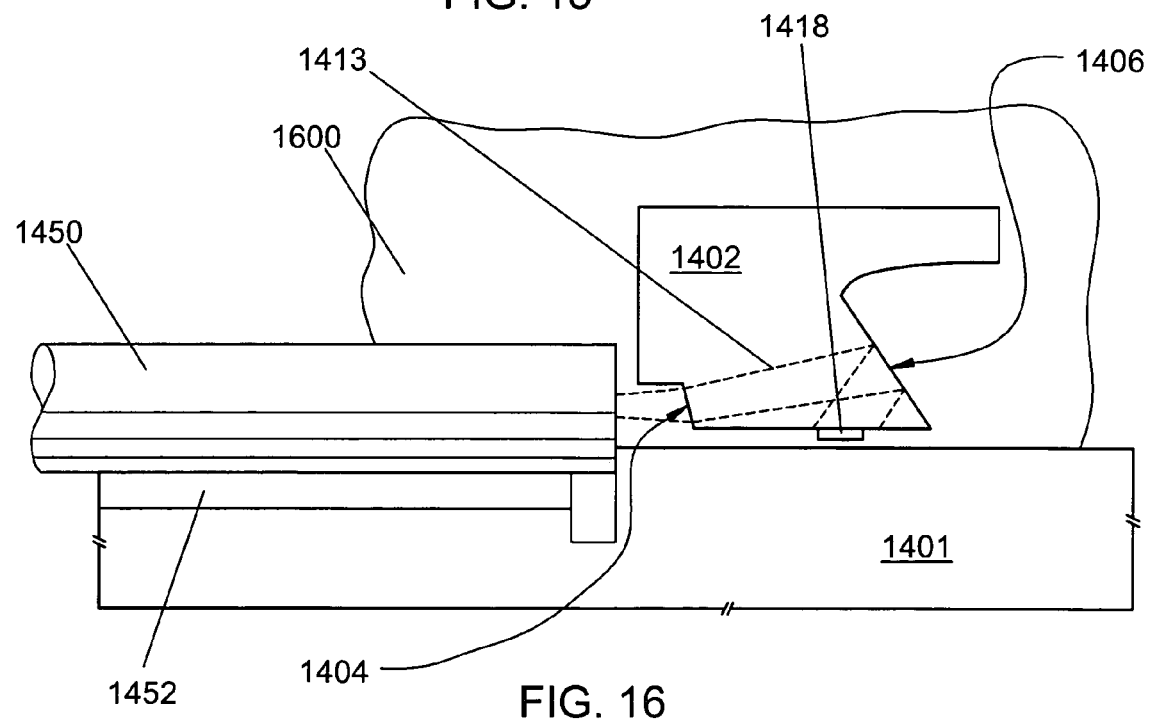
FIG. 16 illustrates mounting of a photodetector with an internal reflector onto a grooved substrate with an optical fiber.

FIG. 14 shows an exemplary photodetector fabricated according to the present disclosure, including detector substrate 1402, entrance face 1404, internal reflector face 1406, and photodetector active region 1418, mounted on a grooved substrate 1401 (support/alignment structures omitted for clarity). Groove 1452 is adapted for receiving an optical fiber 1450. This exemplary assembly is similar to that of FIG. 8, with the planar waveguide replaced by an optical fiber. Substrate 1401 is provided with support/alignment structures (not shown) suitably positioned so that a substantial portion of an optical beam 1413 emerging from optical fiber 1450 (when positioned in groove 1452) enters entrance face 1404, reflects from reflecting face 1406, and impinges on active region 1418. The substrate 1401 may include: a pocket or recess for accommodating downward-protruding portions of the photodetector upon mounting; electrical contacts or traces; and/or support/alignment structures for mounting the photodetector on the substrate. The optical path between the end of the fiber 1450 and photodetector entrance face 1404 may be filled with substantially transparent embedding medium or encapsulant 1600 (as described hereinabove), or the photodetector and adjacent end portion of the fiber may be encapsulated by encapsulant 1600 (FIG. 16). In another exemplary embodiment (not shown), a groove is formed directly on the detector substrate 1402 and an optical fiber is mounted therein. Such an embodiment may function in a manner similar FIGS. 14 and 16, without the use of a second substrate for separate mounting of the photodetector and fiber.

Another exemplary embodiment of a photodetector with an internal reflector is illustrated in FIGS. 9A and 9B, which shows a photodetector active region 918 on a photodetector substrate 902, along with any required electrical contacts and/or traces. The photodetector may be a p-i-n photodetector on an InP substrate as described above, or any other suitable photodetector provided on a suitable substrate. Substrate 902 is further provided with a silica-based, polymer, or other low-index dielectric slab 912 with an entrance face 913 and an angle-etched reflecting face 914. The angled face 914 may be fabricated at an angle sufficiently shallow for total internal reflection of light propagating with slab 912 downward toward substrate 902. Alternatively, angled reflecting face 914 may be provided with a reflective coating (metal, dielectric, or other) for reflecting light down toward the substrate. The angled face 914 is positioned so as to direct an optical beam propagating within slab 912 down onto photodetector 918. A intervening reflector layer 916 (metal, multi-layer dielectric, or other suitable reflector) may be employed between substrate 902 and slab 912 to substantially prevent leakage of light from layer 912 into substrate 902 before reaching active region 918. An optical beam entering slab 912 through entrance face 913 may propagate toward face 914 and be reflected onto photodetector 918. FIG. 10 shows the photodetector of FIGS. 9A and 9B inverted and flip-chip mounted on a planar waveguide substrate 1001 and positioned for receiving light emerging from and end of planar waveguide 1020 and directing the light onto photodetector 918 (support/alignment structures omitted for clarity). Entrance face 913 and/or reflecting face 914 may be substantially planar, or may be suitably curved in one or both dimensions so as to reduce the divergence of an incident optical beam. The mounted photodetector embodiment of FIG. 10 may include a substantially transparent embedding medium between the waveguide and photodetector, or may be encapsulated in a manner similar to FIG. 15. The photodetector embodiment of FIGS. 9A and 9B may alternatively by mounted on a substrate with an optical fiber in a manner similar to that shown in FIG. 14 or 16.

Another exemplary embodiment of a photodetector with an internal reflector is illustrated in FIGS. 11A and 11B. A photodetector active region 1118 is provided on photodetector substrate 1102, along with any necessary electrical contacts and/or traces. The photodetector may be a p-i-n photodetector on an InP substrate as described above, or any other suitable photodetector provided on a suitable substrate. A silica-based, polymer, or other low-index waveguide 1112 (of any suitable type, including a core/clad waveguide) may be fabricated on the substrate 1102 and provided with an angled end-face 1114 positioned above the photodetector active region 1118. The angled end face 1114 may be fabricated at an angle shallow enough to result in total internal reflection of optical power propagating through waveguide 1112 onto photodetector active region 1118. Alternatively, reflecting face 1114 may be provided with a reflective coating (metal, dielectric, or other) for efficiently reflecting light down toward the substrate.

An input portion 1116 of waveguide 1112 may be adapted in a variety of ways for receiving optical power for detection by the photodetector. FIG. 12 shows a photodetector as in FIGS. 11A and 11B (including substrate 1102, photodetector 1118, and waveguide 1112) inverted and flip-chip mounted onto a planar waveguide substrate 1201 (support/alignment structures omitted for clarity). Waveguide 1220 and input end 1116 of waveguide 1112 are adapted in this example for end-transfer of optical power therebetween, requiring sufficiently precise relative positioning and alignment for achieving an operationally acceptable degree of optical power transfer. The exit face of waveguide 1220, the entrance face of the waveguide 1112, and/or the reflecting face 1114 may be flat, or one or more of them may be suitably curved in one or both dimensions for reducing the divergence of an incident optical beam. FIG. 13 shows a photodetector as in FIGS. 11A and 11B (including substrate 1102, photodetector 1118, and waveguide 1112) inverted and flip-chip mounted onto a planar waveguide substrate 1301 (support/alignment structures omitted for clarity). Waveguide 1320 and input end 1116 of waveguide 1112 are adapted in this example for transverse-transfer of optical power therebetween (mode-interference-coupled or substantially adiabatically coupled), requiring sufficiently precise relative positioning and alignment for achieving an operationally acceptable degree of optical power transfer (typically with tolerances relaxed relative to end-transfer). Reflecting face 1114 may be flat or suitably curved in one or both dimensions for reducing the divergence of an incident optical beam. The mounted photodetector embodiment of FIG. 12 may include a substantially transparent embedding medium between fiber and photodetector, or may be encapsulated in a manner similar to FIG. 15. The mounted photodetector embodiment of FIG. 13 may also be encapsulated in a manner similar to FIG. 15. The photodetector embodiment of FIGS. 11A and 11B may alternatively by mounted on a substrate with an optical fiber in a manner similar to that shown in FIG. 14 or 16.

In the exemplary embodiments disclosed thus far, the entrance and reflecting faces of the photodetector have been shown substantially parallel to one another in the horizontal dimension (as in FIGS. 2B, 3B, 5B, 7B, 9B, and 11B), and an optical beam enters through the entrance face near normal incidence in the horizontal dimension (as in FIG. 17). Redirection of the incident optical beam is primarily in the vertical dimension (as shown in FIGS. 8 and 14–16), and the point of transmission through the entrance face, the point of reflection from the reflecting face, and the illuminated portion of the photodetector active area are all substantially lined up with one another in the horizontal dimension (as in FIG. 17, which shows optical beam 1701 transmitted through entrance face 1704, reflected from reflecting face 1706, and impinging on photodetector active area 1710). The nominal planes of incidence with respect to the entrance face and the reflecting face are the same substantially vertical plane in the arrangement of FIG. 17. In some instances it may be desirable for the optical beam to be redirected in both horizontal and vertical dimensions upon internal reflection (as in FIGS. 18 and 19). In these arrangements the respective planes of incidence relative to the entrance face and reflecting face are not parallel, and the plane of incidence relative to the reflecting face is not vertical. Such multi-dimensional beam redirection typically results in a larger angle of incidence as the optical beam impinges on the photodetector active area, in turn resulting in an increased effective interaction length through the thickness of the active area. Detection efficiency may therefore be increased by increasing the interaction length, and achieving this through a larger angle of incidence may enable use of thinner (and therefore more readily and/or inexpensively fabricated) material layers to form the photodetector active area. In addition, beam redirection in both horizontal and vertical dimensions may allow positioning of the photodetector on a waveguide substrate at varying orientations relative to waveguide(s) on the substrate (i.e., some beam steering occurs within the photodetector substrate), enabling more compact assembly of optical devices using less waveguide substrate area.

In the exemplary embodiment of FIG. 18, the entrance face 1804 and reflecting face 1806 are substantially parallel, with incident optical beam 1801 off-normal (horizontally) upon transmission through entrance face 1804. Refraction results in horizontal redirection of the optical beam and off-normal incidence (horizontally) on reflecting face 1806. Photodetector active area 1810 is positioned so as to receive at least a portion of the optical beam reflected from face 1806. The point of transmission through face 1804, the point of reflection from face 1806, and the portion of active area 1810 illuminated by the reflected optical beam do not lie along a line when viewed from above, and the incidence angle on the photodetector active area is larger than for horizontally aligned embodiments. In the exemplary embodiment of FIG. 19, the entrance face 1904 and reflecting face 1906 are not parallel, and the incident optical beam 1901 is substantially normal (horizontally) upon transmission through entrance face 1904. Non-parallel arrangement of the faces 1904 and 1906 results in off-normal incidence (horizontally) on reflecting face 1906. Photodetector active area 1910 is positioned so as to receive at least a portion of the optical beam reflected from face 1906. The point of transmission through face 1904, the point of reflection from face 1906, and the portion of active area 1910 illuminated by the reflected optical beam do not lie along a common line when viewed from above, and the incidence angle on the photodetector active area is larger than for horizontally aligned embodiments. Additional embodiments may be implemented with both off-normal incidence at the entrances face and non-parallel arrangement of the entrance and reflecting faces.

For purposes of the foregoing written description and/or the appended claims, the term "optical waveguide" (or equivalently, "waveguide" or "transmission optical element") as employed herein shall denote a structure adapted for supporting one or more optical modes. Such waveguides shall typically provide confinement of a supported optical mode in two transverse dimensions while allowing propagation along a longitudinal dimension. The transverse and longitudinal dimensions/directions shall be defined locally for a curved waveguide; the absolute orientations of the transverse and longitudinal dimensions may therefore vary along the length of a curvilinear waveguide, for example. Examples of optical waveguides may include, without being limited to, various types of optical fiber and various types of planar waveguides. The term "planar optical waveguide" (or equivalently, "planar waveguide") as employed herein shall denote any optical waveguide that is formed on a substantially planar substrate. The longitudinal dimension (i.e., the propagation dimension) shall be considered substantially parallel to the substrate. A transverse dimension substantially parallel to the substrate may be referred to as a lateral or horizontal dimension, while a transverse dimension substantially perpendicular to the substrate may be referred to as a vertical dimension. Examples of such waveguides include ridge waveguides, buried waveguides, semiconductor waveguides, other high-index waveguides ("high-index" being above about 2.5), silica-based waveguides, polymer waveguides, other low-index waveguides ("low-index" being below about 2.5), core/clad type waveguides, multi-layer reflector (MLR) waveguides, metal-clad waveguides, air-guided waveguides, vacuum-guided waveguides, photonic crystal-based or photonic bandgap-based waveguides, waveguides incorporating electro-optic (EO) and/or electro-absorptive (EA) materials, waveguides incorporating non-linear-optical (NLO) materials, and myriad other examples not explicitly set forth herein which may nevertheless fall within the scope of the present disclosure and/or appended claims. Many suitable substrate materials may be employed, including semiconductor, crystalline, silica or silica-based, other glasses, ceramic, metal, and myriad other examples not explicitly set forth herein which may nevertheless fall within the scope of the present disclosure and/or appended claims.

One exemplary type of planar optical waveguide that may be suitable for use with optical components disclosed herein is a so-called PLC waveguide (Planar Lightwave Circuit). Such waveguides typically comprise silica or silica-based waveguides (often ridge or buried waveguides; other waveguide configuration may also be employed) supported on a substantially planar silicon substrate (often with an interposed silica or silica-based optical buffer layer). Sets of one or more such waveguides may be referred to as planar waveguide circuits, optical integrated circuits, or opto-electronic integrated circuits. A PLC substrate with one or more PLC waveguides may be readily adapted for mounting one or more optical sources, lasers, modulators, and/or other optical devices adapted for end-transfer of optical power with a suitably adapted PLC waveguide. A PLC substrate with one or more PLC waveguides may be readily adapted (according to the teachings of U.S. Patent Application Pub. No. 2003/0081902 and/or U.S. application No. 60/466,799, for example) for mounting one or more optical sources, lasers, modulators, photodetectors, and/or other optical devices adapted for transverse-transfer of optical power with a suitably adapted PLC waveguide (mode-interference-coupled, or substantially adiabatic, transverse-transfer; also referred to as transverse-coupling).

For purposes of the foregoing written description and/or appended claims, "spatially-selective material processing techniques" shall encompass epitaxy, layer growth, lithography, photolithography, evaporative deposition, sputtering, vapor deposition, chemical vapor deposition, beam deposition, beam-assisted deposition, ion beam deposition, ion-beam-assisted deposition, plasma-assisted deposition, wet etching, dry etching, ion etching (including reactive ion etching), ion milling, laser machining, spin deposition, spray-on deposition, electrochemical plating or deposition, electroless plating, photo-resists, UV curing and/or densification, micro-machining using precision saws and/or other mechanical cutting/shaping tools, selective metallization and/or solder deposition, chemical-mechanical polishing for planarizing, any other suitable spatially-selective material processing techniques, combinations thereof, and/or functional equivalents thereof. In particular, it should be noted that any step involving "spatially-selectively providing" a layer or structure may involve either or both of: spatially-selective deposition and/or growth, or substantially uniform deposition and/or growth (over a given area) followed by spatially-selective removal. Any spatially-selective deposition, removal, or other process may be a so-called direct-write process, or may be a masked process. It should be noted that any "layer" referred to herein may comprise a substantially homogeneous material layer, or may comprise an inhomogeneous set of one or more material sub-layers. Spatially-selective material processing techniques may be implemented on a wafer scale for simultaneous fabrication/processing of multiple structures on a common substrate wafer.

It should be noted that various components, elements, structures, and/or layers described herein as "secured to", "connected to", "mounted on", "deposited on", "formed on", "positioned on", etc., a substrate may make direct contact with the substrate material, or may make contact with one or more other layer(s) and/or other intermediate structure(s) already present on the substrate, and may therefore be indirectly "secured to", etc, the substrate. It should also be noted that words and phrases such as "substrate upper surface", "vertical", "horizontal", "height", "level", and the like, when used in describing the photodetector substrate, are not intended to denote absolute directions or positions in space, but are intended rather to denote directions or positions relative to the processed surface of a semiconductor substrate or wafer. The "substrate upper surface" refers to the processed substrate surface (or the surface where at least a majority of processing occurs, forming the faces and active area); "horizontal" refers to directions substantially parallel to the processed surface; "vertical", "height", "level", and so forth refer to the direction substantially perpendicular to the processed surface; and so on.

The phrase "operationally acceptable" appears herein describing levels of various performance parameters of photodetectors, such as collection efficiency, detector responsivity, detection bandwidth, and so forth. An operationally acceptable level may be determined by any relevant set or subset of applicable constraints and/or requirements arising from the performance, fabrication, device yield, assembly, testing, availability, cost, supply, demand, and/or other factors surrounding the manufacture, deployment, and/or use of a photodetector or optical assembly into which it may be incorporated. Such "operationally acceptable" levels of such parameters may therefor vary depending on such constraints and/or requirements. For example, a lower collection efficiency may be an acceptable trade-off for achieving higher detection bandwidth in some instances, while higher collection efficiency may be required in other instances in spite of decreased detection bandwidth. The "operationally acceptable" collection efficiency and detection bandwidth therefore vary between the instances. Many other examples of such trade-offs may be imagined. Semiconductor photodetectors, fabrication methods therefor, and incorporation thereof into optical devices and/or assemblies, as disclosed herein and/or equivalents thereof, may therefore be implemented within tolerances of varying precision depending on such "operationally acceptable" constraints and/or requirements. Phrases such as "substantially transparent", "substantially adiabatic", "substantially spatial-mode-matched", "substantially parallel", "substantially normal incidence", and so on as used herein shall be construed in light of this notion of "operationally acceptable" performance.

While particular examples have been disclosed herein employing specific materials and/or material combinations and having particular dimensions and configurations, it should be understood that other suitable materials and/or material combinations may be employed in a range of dimensions and/or configurations while remaining within the scope of inventive concepts disclosed and/or claimed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: i) it is explicitly stated otherwise, e.g., by use of "either . . . or", "only one of . . . ", or similar language; or ii) two or more of the listed alternatives are mutually exclusive within the particular context, in which case "or" would encompass only those combinations involving non-mutually-exclusive alternatives. It is intended that equivalents of the disclosed exemplary embodiments and methods shall fall within the scope of the present disclosure and/or appended claims. It is intended that the disclosed exemplary embodiments and methods, and equivalents thereof, may be modified while remaining within the scope of the present disclosure or appended claims.

What is claimed is:

1. A method, comprising:
   receiving into a semiconductor substrate through an entrance face formed at a surface thereof an incident optical beam propagating substantially parallel to the substrate surface, and refracting the optical beam away from the substrate surface, the entrance forming an angle with the substrate surface;
   reflecting internally toward the substrate surface at least a portion of the refracted optical beam from a reflecting face formed on the substrate at the substrate surface and forming an acute angle therewith; and
   receiving a least a portion of the reflected optical beam at a photodetector active region formed at the substrate surface.

2. The method of claim 1, wherein the photodetector active region comprises a p-i-n photodiode.

3. The method of claim 2, wherein the substrate comprises InP, and wherein the p-i-n photodiode comprises an InP n-layer, an InGaAs i-layer, and an InP p-layer.

4. The method of claim 1, wherein the photodetector active region comprises an avalanche photodiode.

5. The method of claim 1, wherein the entrance face forms an angle with the substrate surface greater than 90° and less than about 105°.

6. The method of claim 1, wherein the entrance face includes an anti-reflection coating thereon.

7. The method of claim 1, wherein the entrance face includes a wavelength-selective filter coating thereon.

8. The method of claim 1, wherein the reflecting face forms an angle with the substrate surface between about 40° and about 70°.

9. The method of claim 8, wherein an incident optical beam propagating substantially parallel to the substrate surface and transmitted through the entrance face into the substrate undergoes total internal reflection from the reflection face.

10. The method of claim 8, wherein the reflecting face forms an angle with the substrate surface between about 51° and about 60°.

11. The method of claim 8, wherein the reflecting face includes a reflective coating thereon.

12. The method of claim 1, wherein the photodetector active region and the reflecting face are separated by more than about 5 μm at the substrate surface.

13. The method of claim 1, wherein the entrance face and the reflecting face are separated by more than about 50 μm and less than about 250 μm at the substrate surface.

14. The method of claim 1, further comprising transmitting an electrical signal generated by the reflected beam received at the photodetector active region via at least two electrical contacts formed at the substrate surface and connected to the photodetector active region.

15. The method of claim 1, wherein the entrance face and the reflecting face are arranged so that the optical beam, if transmitted through the entrance face at normal incidence, defines a substantially vertical plane of incidence relative to the reflecting face.

16. The method of claim 1, wherein the entrance face and the reflecting face are arranged so that the optical beam, if transmitted through the entrance face at normal incidence, defines a non-vertical plane of incidence relative to the reflecting face.

17. The method of claim 1, wherein the reflecting face is substantially parallel to a crystal plane of the substrate.

18. The method of claim 1, wherein the entrance face or the reflecting face is curved.

19. The method of claim 1, further comprising receiving at least a portion of an optical beam emerging from an end face of a transmission optical element as the incident optical beam, the transmission optical element being positioned on a second substrate, the semiconductor substrate being mounted on the second substrate with the substrate surface facing the second substrate.

20. The method of claim 19, wherein the transmission optical element is a planar waveguide formed on the second substrate.

21. The method of claim 19, wherein the transmission optical element is an optical fiber mounted in a groove on the second substrate.

22. The method of claim 19, wherein the incident optical beam is centered on the entrance face between about 2.5 μm and about 50 μm below the level of the photodetector active region.

23. The method of claim 19, wherein a substantially transparent embedding medium substantially fills an optical path between the end face of the transmission optical element and the entrance face.

24. The method of claim 19, wherein the mounted semiconductor substrate and the end face of the transmission optical element are encapsulated.

25. The method of claim 1, further comprising receiving at least a portion of an optical beam emerging from an end face of an optical fiber as the incident optical beam, the optical fiber being mounted on the substrate in a groove formed thereon.

26. An optical apparatus, comprising:
   a semiconductor substrate having a substrate surface;
   means formed at the substrate surface for receiving into the substrate an incident optical beam propagating substantially parallel to the substrate surface and for refracting the optical beam away from the substrate surface;

means formed at the substrate surface and forming an acute angle therewith for reflecting internally toward the substrate surface at least a portion of the refracted optical beam; and means formed on the substrate surface for detecting at least a portion of the reflected beam incident on the detecting means.

27. The apparatus of claim 26, wherein the detecting means comprises a photodiode.

28. The apparatus of claim 26, wherein the receiving and refracting means comprises an entrance face forming an angle with the substrate surface greater than 90° and less than about 105°.

29. The apparatus of claim 26, wherein the reflecting means comprises a reflecting face forming an angle with the substrate surface between about 40° and about 70°.

30. The apparatus of claim 29, wherein the refracted optical beam undergoes total internal reflection at the reflecting face.

31. The apparatus of claim 29, wherein the reflecting face forms an angle with the substrate surface between about 51° and about 60°.

32. The apparatus of claim 26, further comprising means formed at the substrate surface for transmitting an electrical signal generated by the reflected beam received at the detecting means.

33. The apparatus of claim 26, further comprising a transmission optical element positioned on a second substrate, wherein the semiconductor substrate is mounted on the second substrate with the substrate surface facing the second substrate so that at least a portion of an optical beam emerging from an end face of the transmission optical element is transmitted into the substrate at the receiving and refracting means.

34. The apparatus of claim 33, wherein the transmission optical element is a planar waveguide formed on the second substrate.

35. The apparatus of claim 33, wherein the transmission optical element is an optical fiber mounted in a groove on the second substrate.

* * * * *